(12) United States Patent
Rivoir

(10) Patent No.: US 8,745,568 B2
(45) Date of Patent: Jun. 3, 2014

(54) METHOD AND APPARATUS FOR DETERMINING RELEVANCE VALUES FOR A DETECTION OF A FAULT ON A CHIP AND FOR DETERMINING A FAULT PROBABILITY OF A LOCATION ON A CHIP

(75) Inventor: Jochen Rivoir, Magstadt (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 607 days.

(21) Appl. No.: 12/671,674

(22) PCT Filed: Dec. 17, 2008

(86) PCT No.: PCT/EP2008/010787
§ 371 (c)(1),
(2), (4) Date: Nov. 1, 2010

(87) PCT Pub. No.: WO2010/069344
PCT Pub. Date: Jun. 24, 2010

(65) Prior Publication Data
US 2011/0032829 A1    Feb. 10, 2011

(51) Int. Cl.
G06F 17/50    (2006.01)
(52) U.S. Cl.
USPC .............. 716/136; 716/52; 716/111; 716/112
(58) Field of Classification Search
USPC ................................... 716/52, 111–112, 136
See application file for complete search history.

(56) References Cited

U.S. PATENT DOCUMENTS

| | | | | |
|---|---|---|---|---|
| 4,044,244 A | * | 8/1977 | Foreman et al. | 714/724 |
| 5,241,652 A | * | 8/1993 | Barabash et al. | 706/48 |
| 5,655,074 A | * | 8/1997 | Rauscher | 714/38.1 |
| 6,054,863 A | * | 4/2000 | Morrison et al. | 324/537 |
| 6,519,727 B2 | * | 2/2003 | Noy | 714/724 |
| 6,950,771 B1 | | 9/2005 | Fan et al. | |
| 7,454,963 B2 | * | 11/2008 | Denkmayr | 73/114.77 |
| 7,592,818 B2 | * | 9/2009 | Mori et al. | 324/638 |
| 7,620,856 B2 | * | 11/2009 | Kagan et al. | 714/57 |

(Continued)

OTHER PUBLICATIONS

Varghese et al.; "Simplified ATPG and Analog Fault Location via a Clustering and Separability Technique"; IEEE Transactions on Circuits and Systems, vol. Cas-26, No. 7; Jul. 1979; pp. 496-505.*

(Continued)

Primary Examiner — Naum Levin

(57) ABSTRACT

A method for determining relevance values representing a relevance of a combination of an input node of a first number of input nodes with a measurement node of a second number of measurement nodes for a detection of a fault on a chip applies a third number of tests at the first number of input nodes, measures for each test of the third plurality of tests a signal at each of the second number of measurement nodes to obtain for each measurement node of the second number of measurement nodes a third number of measurement values, and determines the relevance values, wherein each relevance value is calculated based on a correlation between the third number of test input choices defined for the input node of the respective combination and the third number of measurement values associated to the measurement node of the respective combination.

21 Claims, 18 Drawing Sheets

(56) References Cited

U.S. PATENT DOCUMENTS

| | | |
|---|---|---|
| 7,990,887 B2* | 8/2011 | Cidon et al. ............... 370/253 |
| 2002/0143516 A1* | 10/2002 | Rao et al. ................. 703/19 |
| 2004/0168100 A1* | 8/2004 | Thottan et al. ............. 714/4 |
| 2004/0249577 A1* | 12/2004 | Kiiveri et al. .............. 702/20 |
| 2006/0156316 A1* | 7/2006 | Gray ..................... 719/328 |
| 2007/0233445 A1* | 10/2007 | Moskovich et al. .......... 703/14 |
| 2007/0288822 A1* | 12/2007 | Lin et al. ................. 714/741 |
| 2008/0301597 A1 | 12/2008 | Chen et al. |

OTHER PUBLICATIONS

Liu, Fang, et al., "Efficient Simulation of Parametric Faults for Multi-Stage Analog Circuits", IEEE Test Conference 2007, Paper 24.2, pp. 1-9.

Fu, Qiang, et al., "Characterizing Intra-Die Spatial Correlation Using Spectral Density Method", 9th International Symposium on Quality Electronic Design, Piscataway, New Jersey, 2008, pp. 718-723.

Liu, F et al., Efficient Simulation of Parametric Faults for Multi-Stage Analog Circuits, International Test Conference ITC, 2007, Paper 24.2.

* cited by examiner

| Meas at Mx-TI | LP-TI = 2 MHz | LP-TI = 20 MHz |
|---|---|---|
| DAC-I = 1 MHz | 1 | 1 |
| DAC-I = 10 MHz | 0 | 1 |

410 — Inputs (I=4): U(k,i)

460 — Measurements (M=8): Y_d(k,m)

20MHz LP filter passes 10 MHz tone

| Tests (K=16) | DAC-I | DAC-Q | LPTI | LPTQ | Mx-TI | Mx-TQ | PA | LNA | Mx-RI | Mx-RQ | ADC-I | ADC-Q |
|---|---|---|---|---|---|---|---|---|---|---|---|---|
| 1  | 1Mhz  | 1Mhz  | 2Mhz  | 2Mhz  | 1   | 1 | 1   | 1   | 1   | 1   | 1   | 1   |
| 2  | 10Mhz | 1Mhz  | 2Mhz  | 2Mhz  | 0   | 1 | 0.5 | 0.5 | 0.5 | 0.5 | 0.5 | 0.5 |
| 3  | 1Mhz  | 10Mhz | 2Mhz  | 2Mhz  | 1   | 0 | 0.5 | 0.5 | 0.5 | 0.5 | 0.5 | 0.5 |
| 4  | 10Mhz | 10Mhz | 2Mhz  | 2Mhz  | 0   | 0 | 0   | 0   | 0   | 0   | 0   | 0   |
| 5  | 1Mhz  | 1Mhz  | 20Mhz | 2Mhz  | 1   | 1 | 1   | 1   | 1   | 1   | 1   | 1   |
| 6  | 10Mhz | 1Mhz  | 20Mhz | 2Mhz  | 1   | 0 | 0.5 | 0.5 | 0.5 | 0.5 | 0.5 | 0.5 |
| 7  | 1Mhz  | 10Mhz | 20Mhz | 2Mhz  | 1   | 0 | 0.5 | 0.5 | 0.5 | 0.5 | 0.5 | 0.5 |
| 8  | 10Mhz | 10Mhz | 20Mhz | 2Mhz  | 1   | 1 | 1   | 1   | 1   | 1   | 1   | 1   |
| 9  | 1Mhz  | 1Mhz  | 2Mhz  | 20Mhz | 0   | 1 | 0.5 | 0.5 | 0.5 | 0.5 | 0.5 | 0.5 |
| 10 | 10Mhz | 1Mhz  | 2Mhz  | 20Mhz | 1   | 1 | 1   | 1   | 1   | 1   | 1   | 1   |
| 11 | 1Mhz  | 10Mhz | 2Mhz  | 20Mhz | 0   | 1 | 0.5 | 0.5 | 0.5 | 0.5 | 0.5 | 0.5 |
| 12 | 10Mhz | 10Mhz | 2Mhz  | 20Mhz | 1   | 1 | 1   | 1   | 1   | 1   | 1   | 1   |
| 13 | 1Mhz  | 1Mhz  | 20Mhz | 20Mhz | 1   | 1 | 1   | 1   | 1   | 1   | 1   | 1   |
| 14 | 10Mhz | 1Mhz  | 20Mhz | 20Mhz | 1   | 1 | 1   | 1   | 1   | 1   | 1   | 1   |
| 15 | 1Mhz  | 10Mhz | 20Mhz | 20Mhz | 1   | 1 | 1   | 1   | 1   | 1   | 1   | 1   |
| 16 | 10Mhz | 10Mhz | 20Mhz | 20Mhz | 1   | 1 | 1   | 1   | 1   | 1   | 1   | 1   |

U(k,i)

| | DAC-I | DAC-Q | LP-TI | LP-TQ |
|---|---|---|---|---|
| 1 | 1Mhz | 1Mhz | 2Mhz | 2Mhz |
| 2 | 10Mhz | 1Mhz | 2Mhz | 2Mhz |
| 3 | 1Mhz | 10Mhz | 2Mhz | 2Mhz |
| 4 | 10Mhz | 10Mhz | 2Mhz | 2Mhz |
| 5 | 1Mhz | 1Mhz | 20Mhz | 2Mhz |
| 6 | 10Mhz | 1Mhz | 20Mhz | 2Mhz |
| 7 | 1Mhz | 10Mhz | 20Mhz | 2Mhz |
| 8 | 10Mhz | 10Mhz | 20Mhz | 2Mhz |
| 9 | 1Mhz | 1Mhz | 2Mhz | 20Mhz |
| 10 | 10Mhz | 1Mhz | 2Mhz | 20Mhz |
| 11 | 1Mhz | 10Mhz | 2Mhz | 20Mhz |
| 12 | 10Mhz | 10Mhz | 2Mhz | 20Mhz |
| 13 | 1Mhz | 1Mhz | 20Mhz | 20Mhz |
| 14 | 10Mhz | 1Mhz | 20Mhz | 20Mhz |
| 15 | 1Mhz | 10Mhz | 20Mhz | 20Mhz |
| 16 | 10Mhz | 10Mhz | 20Mhz | 20Mhz |

U(k,i)

| | DAC-I | DAC-Q | LP-TI | LP-TQ |
|---|---|---|---|---|
| 1 | 10Mhz | 1Mhz | 2Mhz | 20Mhz |
| 2 | 10Mhz | 10Mhz | 2Mhz | 20Mhz |
| 3 | 10Mhz | 10Mhz | 2Mhz | 2Mhz |
| 4 | 10Mhz | 10Mhz | 2Mhz | 20Mhz |
| 5 | 10Mhz | 10Mhz | 2Mhz | 20Mhz |
| 6 | 1Mhz | 1Mhz | 20Mhz | 20Mhz |
| 7 | 10Mhz | 10Mhz | 20Mhz | 20Mhz |
| 8 | 1Mhz | 1Mhz | 2Mhz | 20Mhz |
| 9 | 1Mhz | 10Mhz | 20Mhz | 20Mhz |
| 10 | 10Mhz | 10Mhz | 2Mhz | 2Mhz |
| 11 | 1Mhz | 10Mhz | 20Mhz | 2Mhz |
| 12 | 10Mhz | 1Mhz | 2Mhz | 2Mhz |
| 13 | 1Mhz | 10Mhz | 20Mhz | 2Mhz |
| 14 | 1Mhz | 10Mhz | 20Mhz | 2Mhz |
| 15 | 10Mhz | 1Mhz | 2Mhz | 20Mhz |
| 16 | 1Mhz | 10Mhz | 20Mhz | 2Mhz |
| 17 | 1Mhz | 10Mhz | 2Mhz | 2Mhz |
| 18 | 10Mhz | 10Mhz | 2Mhz | 20Mhz |
| 19 | 1Mhz | 1Mhz | 20Mhz | 20Mhz |
| 20 | 10Mhz | 10Mhz | 2Mhz | 2Mhz |
| 21 | 1Mhz | 10Mhz | 2Mhz | 20Mhz |
| 22 | 10Mhz | 1Mhz | 2Mhz | 20Mhz |
| 23 | 10Mhz | 1Mhz | 2Mhz | 2Mhz |
| 24 | 10Mhz | 10Mhz | 20Mhz | 20Mhz |
| 25 | 1Mhz | 10Mhz | 2Mhz | 20Mhz |

| Meas at Mx-TI No fault, Fault | LPTI = 2 MHz | LPTI = 20 MHz |
|---|---|---|
| DAC-I = 1 MHz | 1, 1 | 1, 1 |
| DAC-I = 10 MHz | 0, 0 | 1, 0.5 |

| Tests (k=16) | Inputs (I=4) DAC-I | DAC-Q | LPT-I | LPT-Q | Measurements (M=8) Mx-TI | Mx-TQ | PA | LNA | Mx-RI | Mx-RQ | ADC-I | ADC-Q |
|---|---|---|---|---|---|---|---|---|---|---|---|---|
| 1 | 1Mhz | 1Mhz | 2Mhz | 2Mhz | 1 | 1 | 1 | 1 | 1 | 1 | 1 | 1 |
| 2 | 10Mhz | 1Mhz | 2Mhz | 2Mhz | 0 | 1 | 0.5 | 0.5 | 0.5 | 0.5 | 0.5 | 0.5 |
| 3 | 1Mhz | 10Mhz | 2Mhz | 2Mhz | 1 | 0 | 0.5 | 0.5 | 0.5 | 0.5 | 0.5 | 0.5 |
| 4 | 10Mhz | 10Mhz | 2Mhz | 2Mhz | 0 | 0 | 0 | 0 | 0 | 0 | 0 | 0 |
| 5 | 1Mhz | 1Mhz | 20Mhz | 2Mhz | 1 | 1 | 1 | 1 | 1 | 1 | 1 | 1 |
| 6 | 10Mhz | 1Mhz | 20Mhz | 2Mhz | 0.5 | 1 | 0.75 | 0.75 | 0.75 | 0.75 | 0.75 | 0.75 |
| 7 | 1Mhz | 10Mhz | 20Mhz | 2Mhz | 1 | 0 | 0.5 | 0.5 | 0.5 | 0.5 | 0.5 | 0.5 |
| 8 | 10Mhz | 10Mhz | 20Mhz | 2Mhz | 0.5 | 0 | 0.25 | 0.25 | 0.25 | 0.25 | 0.25 | 0.25 |
| 9 | 1Mhz | 1Mhz | 2Mhz | 20Mhz | 1 | 1 | 1 | 1 | 1 | 1 | 1 | 1 |
| 10 | 10Mhz | 1Mhz | 2Mhz | 20Mhz | 0 | 1 | 0.5 | 0.5 | 0.5 | 0.5 | 0.5 | 0.5 |
| 11 | 1Mhz | 10Mhz | 2Mhz | 20Mhz | 1 | 1 | 0.75 | 0.75 | 0.75 | 0.75 | 0.75 | 0.75 |
| 12 | 10Mhz | 10Mhz | 2Mhz | 20Mhz | 0 | 1 | 1 | 1 | 1 | 1 | 1 | 1 |
| 13 | 1Mhz | 1Mhz | 20Mhz | 20Mhz | 1 | 1 | 1 | 1 | 1 | 1 | 1 | 1 |
| 14 | 10Mhz | 1Mhz | 20Mhz | 20Mhz | 0.5 | 1 | 0.75 | 0.75 | 0.75 | 0.75 | 0.75 | 0.75 |
| 15 | 1Mhz | 10Mhz | 20Mhz | 20Mhz | 1 | 1 | 1 | 1 | 1 | 1 | 1 | 1 |
| 16 | 10Mhz | 10Mhz | 20Mhz | 20Mhz | 0.5 | 1 | 0.75 | 0.75 | 0.75 | 0.75 | 0.75 | 0.75 |

Faulty 20MHz LP filter passes only half of 10 MHz tone

FIG 9

V(k,i) — Inputs (I=4)

| Tests (K=16) | DAC-I | DAC-Q | LP-TI | LP-TQ |
|---|---|---|---|---|
| 1 | -1 | -1 | -1 | -1 |
| 2 | -1 | -1 | -1 | 1 |
| 3 | -1 | -1 | 1 | -1 |
| 4 | -1 | -1 | 1 | 1 |
| 5 | -1 | 1 | -1 | -1 |
| 6 | -1 | 1 | -1 | 1 |
| 7 | -1 | 1 | 1 | -1 |
| 8 | -1 | 1 | 1 | 1 |
| 9 | 1 | -1 | -1 | -1 |
| 10 | 1 | -1 | -1 | 1 |
| 11 | 1 | -1 | 1 | -1 |
| 12 | 1 | -1 | 1 | 1 |
| 13 | 1 | 1 | -1 | -1 |
| 14 | 1 | 1 | -1 | 1 |
| 15 | 1 | 1 | 1 | -1 |
| 16 | 1 | 1 | 1 | 1 |

Z(k,m) — Measurements (M=8)

| Test | Mx-TI | Mx-TQ | PA | LNA | Mx-RI | Mx-RQ | ADC-I | ADC-Q |
|---|---|---|---|---|---|---|---|---|
| 1 | 0 | 0 | 0 | 0 | 0 | 0 | 0 | 0 |
| 2 | 0 | 0 | 0 | 0 | 0 | 0 | 0 | 0 |
| 3 | 0 | 0 | 0 | 0 | 0 | 0 | 0 | 0 |
| 4 | 0 | 0 | 0 | 0 | 0 | 0 | 0 | 0 |
| 5 | -5 | 0 | -2.5 | -2.5 | 0 | 0 | -2.5 | -2.5 |
| 6 | 0 | 0 | 0 | 0 | -2.5 | -2.5 | 0 | 0 |
| 7 | -5 | 0 | -2.5 | -2.5 | -2.5 | -2.5 | -2.5 | -2.5 |
| 8 | 0 | 0 | 0 | 0 | 0 | 0 | 0 | 0 |
| 9 | 0 | 0 | 0 | 0 | 0 | 0 | 0 | 0 |
| 10 | 0 | 0 | 0 | 0 | 0 | 0 | 0 | 0 |
| 11 | 0 | 0 | 0 | 0 | 0 | 0 | 0 | 0 |
| 12 | 0 | 0 | 0 | 0 | 0 | 0 | 0 | 0 |
| 13 | -5 | 0 | -2.5 | -2.5 | -2.5 | -2.5 | -2.5 | -2.5 |
| 14 | 0 | 0 | 0 | 0 | 0 | 0 | 0 | 0 |
| 15 | -5 | 0 | -2.5 | -2.5 | -2.5 | -2.5 | -2.5 | -2.5 |
| 16 | 0 | 0 | 0 | 0 | 0 | 0 | 0 | 0 |

```
function Paths = graph_findpaths(E,n1,n2)
%% Find paths from node n1 to node n2 in graph with edges E.
% E(e,:): Graph edge e
%         E(e,1) = Start node number of edge e
%         E(e,2) = End node number of edge e
% Paths{p}(j): Node number of j-th node in p-th path
Path = n1; n=n1; % Start with n1
while 1
    eb = find(E(:,1)==n); % Edge numbers branching from n
    nb = E(eb,2); % Nodes brunched from n
    switch length(nb)
        case 0 % No node branching from n, n is an end-node
            Paths = []; break
        case 1 % One node branching from n
            Path = [Path nb];
            n = nb;
            if n==n2, Paths{1} = Path; break, end
        otherwise % Branching into multiple paths --> Recursive call
            Paths = [];
            for b=1:length(nb) % Branches
                subpaths = praph_findpaths(E,nb(b),n2); % Starting from nb(b)
                for s=1:length(subpaths)
                    if ~isempty(subpaths{s}) % Append to 'Paths' and add
                        Paths{end+1} = [Path subpahs{s}];
                    end
                end
            end
            break
    end
end
```

FIG 13

```
function dist = polygon_ndist(Point,Polygon);
% Returns closest distance from 'Point' to 'Polygon'.
%
% Point(n) : n-th coordinate of point in N-dimensional space
% Polygon(n,v) : n-th coordinate of v-th polygon vertex (a.k.a. node)
%                N x V matrix, N dimensional space, V vertices
% dist : distance from 'Point' to 'Polygon'
%
% Check distances to each line segment
[N,V] = size(Polygon);
for s=1:V-1 % Segment s between vertices s and s+1
    dist_seg(s) = segment_dist(Point,Polygon(:,s),Polygon(:,s+1));
end
% Return the smallest distance to any of the segments
dist = min(dist_seg);

function d = segment_dist(x,x1,x2)
% Returns distance d from point x to a line segment between points x1, x2.
% x, x1, x2 are points in n-dimentional space.
%
% t is parameter from x1 (t=0) to x2 (t=1)
S = (x2-x1)'*(x2-x1); % Length of segment
t= -(x1-x)'*(x2-x1)/S;
if t<=0, d = norm(x-x1); % Before x1, x1 is closest
elseif t>=1, d = norm(x-x2); % After x2, x2 is closest
else xt = x1 + t*(x2-x1); d =norm(x-xt); % Line is closest
end
```

FIG 15

METHOD AND APPARATUS FOR DETERMINING RELEVANCE VALUES FOR A DETECTION OF A FAULT ON A CHIP AND FOR DETERMINING A FAULT PROBABILITY OF A LOCATION ON A CHIP

BACKGROUND OF THE INVENTION

The present invention relates to the testing of chips or other devices and to the diagnosing of faults on those chips or devices, for example in analog or radio frequency (RF) circuits.

In a known method, the circuit behavior is simulated for each possible fault under each relevant combination of process parameters and stored in a fault dictionary. The measurements of a diagnosed circuit or device under test (DUT) are compared to all entries in the fault dictionary, wherein the most similar entry of the fault dictionary identifies the diagnosed fault. This method is straightforward, but involves a large number of long running simulations. Furthermore, it involves modeling of the test conditions. An example is described by F. Liu, S. O. Ozev: "Efficient Simulation of Parametric Faults for Multi-Stage Analog Circuits, ITC 2007.

The ability to diagnose faults is essential for yield learning, for example, improving the yield during production, but corrective action is only possible when the physical nature of a fault is known. In contrast to fault diagnosis for digital systems, no practical method is known for faults that expose themselves as parametric variation, for example, in analogue or radio frequency (RF) circuits.

SUMMARY

According to an embodiment, a method for determining relevance values $R(i,m)$, each relevance value representing a relevance of a combination $(i,m)$ of an input node i of a first number I of input nodes with a measurement node m of a second number M of measurement nodes for a detection of a fault on a chip, may have the steps of: applying a third number K of tests at the first number I of input nodes, wherein each test k of the third number K of tests defines for each input node i a test input choice $U(k,i)$; measuring for each test k of the third plurality K of tests a signal at each of the second number M of measurement nodes to obtain for each measurement node m of the second number M of measurement nodes a third number K of measurement values, wherein each measurement value $Y(k,m)$ is associated to the test k it was measured for and to each measurement node m it was measured at; determining the relevance values $R(i,m)$, wherein each relevance value is calculated based on a correlation between the third number K of test input choices $U(k,i)$ defined for the input node i of the respective combination and the third number K of measurement values $Y(k,m)$ associated to the measurement node m of the respective combination $(i,m)$.

According to another embodiment, a method for determining a fault probability $F(x,y,z)$ of a location $(x,y,z)$ on a chip may have the steps of: determining relevance values $R(i,m)$, each relevance value representing a relevance of a combination $(i,m)$ of an input node i of a first number I of input nodes with a measurement node m of a second number M of measurement nodes for a detection of a fault on a chip, determining for each signal path p of a fourth number P of signal paths of the chip, a distance $L((x,y,z),i,m,p)$ from the location $(x,y,z)$ to each of the fourth number P of signal paths of the chip, wherein each signal path p extends from an input node i of the first number I of input nodes to a measurement node m of the second number M of measurement nodes; and determining the fault probability $F(x,y,z)$ based on adding the distances $L((x,y,z),i,m,p)$ to each of the fourth number (P) of paths weighted by the relevance value $R(i,m)$ of the combination of the input node i, the respective path p extends from, and the measurement node m the respective path p extends to.

Another embodiment may have an apparatus for performing a method of claim 1.

Another embodiment may have a computer program for performing, when running on a computer, the method for determining relevance values, each relevance value representing a relevance of a combination of an input node of a first number of input nodes with a measurement node of a second number of measurement nodes for a detection of a fault on a chip, the method having the steps of: applying a third number of tests at the first number of input nodes, wherein each test of the third number of tests defines for each input node a test input choice; measuring for each test of the third plurality of tests a signal at each of the second number of measurement nodes to acquire for each measurement node of the second number of measurement nodes a third number of measurement values, wherein each measurement value is associated to the test it was measured for and to the measurement node it was measured at; determining the relevance values, wherein each relevance value is calculated based on a correlation between the third number of test input choices defined for the input node of the respective combination and the third number of measurement values associated to the measurement node of the respective combination.

Another embodiment may have a computer program for performing, when running on a computer, the method for determining a fault probability of a location on a chip, the method having the steps of: determining relevance values according to claim 1, each relevance value representing a relevance of a combination of an input node of a first number of input nodes with a measurement node of a second number of measurement nodes for a detection of a fault on a chip, determining for each signal path of a fourth number of signal paths of the chip, a distance from the location to each of the fourth number of signal paths of the chip, wherein each signal path extends from an input node of the first number of input nodes to a measurement node of the second number of measurement nodes; and determining the fault probability based on adding the distances to each of the fourth number of paths weighted by the relevance value of the combination of the input node the respective path extends from, and the measurement node the respective path extends to.

The present invention is based on the finding that when a deviation of a measurement m correlates with an input i across a test suite, the diagnosed fault location is between the location $A(i)$ where input i is applied and the location $B(m)$ where measurement m is taken. This assumes that input i sensitizes the fault.

When input i influences only fault detectability and when a signal graph is known, a diagnosed fault location is on a signal path through $A(i)$ to $B(m)$.

Superposition of all correlations $C(i,m)$ of measurements m with inputs i, weighted with the overall deviations of measurement m, reduces the location ambiguity.

Embodiments of the present invention need no fault model, no detailed knowledge of the device, no modeling of tests, and no simulation at all.

For certain embodiments, only the location of the input node, where the inputs i are applied, and the positions of the measurement nodes m, where the measurements m are taken, need to be known.

For further embodiments, additionally the location of the signal paths p connecting certain input nodes i with certain measurement nodes m are known. Those embodiments enable a precise automatic localization of a faulty circuit element of the chip.

BRIEF DESCRIPTION OF THE DRAWINGS

Embodiments of the present invention will be detailed subsequently referring to the appended drawings, in which:

FIG. 2 shows an exemplary table with measurement values at the first mixer Mx-TI depending on the input choices of the first digital-to-analog converter DAC-I, and the first low pass filter LP-TI.

FIG. 4 shows exemplary input choices U(k,i) and corresponding measurement values Yd(k,m) generated by an embodiment of the invention.

FIG. 5 shows an exemplary input table comprising all possible combinations of input choices U(k,i) and a second input table comprising random input choices U(k,i) generated by an embodiment of the invention.

FIG. 6 shows the exemplary input table of FIG. 4 in an enumerated version of the input choice table of FIG. 4 and the deviations µY(k,m) of the corresponding measurements as shown in FIG. 4 across D devices generated by an embodiment of the invention.

FIG. 7 shows the table of FIG. 2 comprising additionally exemplary measurement values for a faulty device.

FIG. 8 shows the exemplary input choices U(k,i) of FIG. 4 and measurement values Y(k,m) of the faulty device generated by an embodiment of the invention.

FIG. 9 shows normalized input choices V(k,i) derived from the input choices U(k,i) of FIG. 8, and normalized deviation values Z(k,m) derived from the measurement values Y(k,m) of FIG. 8.

FIG. 13 shows a pseudo code of an algorithm of an embodiment for finding paths in a signal graph.

FIG. 15 shows pseudo codes for algorithms of embodiments of the present invention to calculate the closest distance from a location to a polygon and for a calculation of a distance of a location to a line segment.

DETAILED DESCRIPTION OF THE INVENTION

In the following, the same reference numbers will be used in different drawings for referring to the same features or features of similar functionality.

Within the context of this application, two types of inputs or test inputs are distinguished: "stimuli" and "conditions". Stimuli typically "stimulate" or generate a signal to sensitize a potential fault.

Stimuli can, for example, be:
supply voltages, e.g. Vdd
external waveform generators
internal digital-to-analog converters (DACs).

The locations, where the stimuli are supplied either internal or external, are referred to as stimulus nodes.

The second type of inputs, the conditions, influence the fault detectability by influencing a signal on a signal path from a stimulus node to a measurement node.

Conditions can, for example, be:
gain or filter settings
digital tuning words
bypass modes
Signal path selections, switches
Correction DAC, e.g. offset correction
Temperature.

Locations where these condition inputs are applied are referred to as condition nodes or, in general, input nodes. Both, stimulus nodes and condition nodes, are also referred to as input nodes. Furthermore, stimuli are also referred to as stimulus inputs, stimulus input choices or signals, and conditions as conditions inputs, input choices or parameters, wherein both stimuli and conditions are, in general, also referred to as inputs, test inputs or test input choices. The term "choice" only indicates that typically these inputs are chosen or selected from a plurality of possible inputs.

The stimuli and conditions can be modeled, for example, as one of the following:
floating point numbers, e.g. supply voltage,
integers, e.g. DAC code word,
Boolean,
Enumerate types, e.g. the stimulus being a fast sine, slow sine or ramp function, wherein the enumerated types are modeled as multiple Boolean inputs at the same location.

It should be noted that waveforms are typically modeled as choices from available waveforms, for example, as explained above for the enumerated types, and not as arrays.

The locations, where the measurements are performed, or in other words, where values of signals are measured, are referred to as measurement nodes.

Each measurement is modeled as a scalar floating point number. Multiple characteristics, e.g. THD and SINAD, extracted from one captured waveform, as explained with regard to the enumerated input types, count as multiple measurements at the same location, respectively at the same measurement node.

Examples are:
external supply current measurement, e.g. Iddq
built-in current or power or speed sensor
THD value from a captured waveform
Over-range detected: "yes"=+1 or "no"=−1.

Figure 1:
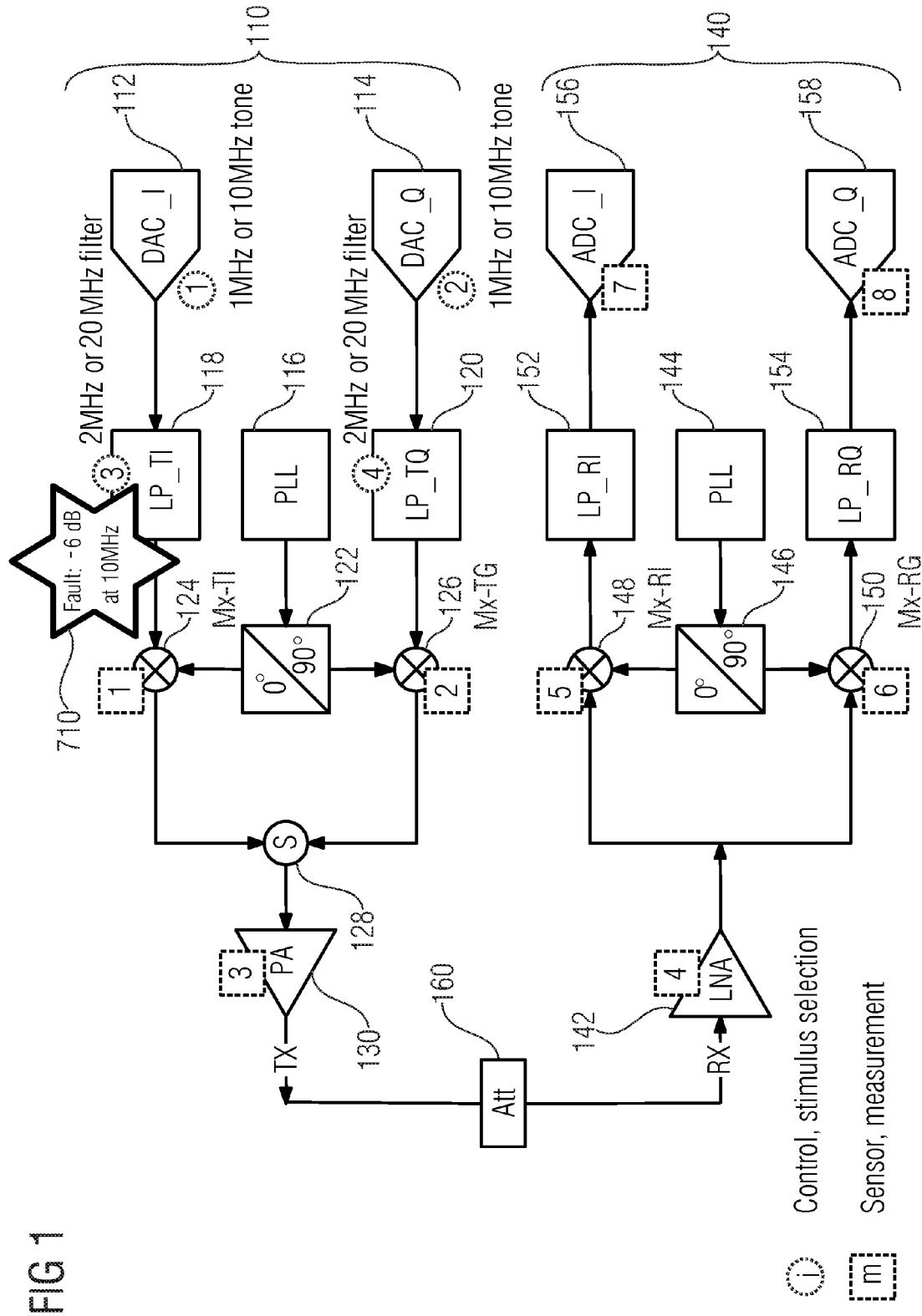
FIG. 1 shows a circuit diagram of a radio frequency transceiver.

FIG. 1 shows an exemplary diagram of a radio frequency (RF) transceiver circuit with 4 inputs or input nodes and 8 measurements or measurement nodes. The transmitter or transmitter part 110 of the transceiver 100 comprises a first digital-to-analog converter DAC_I 112 for converting digital I-signals to analog I-signals, a second digital-to-analog converter DAC_Q 114 for converting digital Q-signals to analog Q-signals, a phase locked loop PLL 116, a first low pass filter LP_TI 118 for low pass filtering of the analog I-signal, a second low pass filter LP_TQ 120 for low pass filtering the analog Q-signal, a phase-shifter 122, a first mixer Mx-TI 124, a second mixer Mx-TQ 126, a summer S 128, and a power amplifier PA 130.

The receiver or receiver part 140 comprises a low noise amplifier LNA 142, a second phase locked loop 144, a second phase-shifter 146, a third mixer Mx-RI 148, a fourth mixer Mx-RQ 150, a first analog-to-digital converter ADC_I 152 for converting an analog I-signal to a digital I-signal, and a second analog-to-digital converter ADC_Q 154 for converting an analog Q-signal to a digital Q-signal.

Furthermore, the transceiver circuit 100 comprises an attenuator element Att 160.

The arrows in FIG. 1 show the signal paths from the different circuit elements of the transceiver circuit 100 and the direction of the respective signal flow.

As can be seen from FIG. 1, an output port of the first digital-to-analog converter DAC_I 112 is connected to an input port of the first low pass filter LP_TI 118, an output port of the second digital-to-analog converter DAC_Q 114 is connected to an input port of the second low pass filter LP_TQ 120, an output port of the phase locked loop 116 is connected to an input port of the phase-shifter 122, and an output port of the first low pass filter LP_TI 118 and a 0° output port of the phase-shifter 122 are connected to input ports of the first mixer Mx-TI 124, an output port of the second low pass filter LP_TQ 120, and a 90° output port of the phase-shifter 122 are connected to input ports of the second mixer Mx-TQ 126, an output port of the first mixer Mx-TI 124, and an output port of the second mixer Mx-TQ 126 are connected to input ports of the summer S 128, an output port of the summer 128 is connected to an input port of the power amplifier 130, and an output port of the power amplifier 130 providing the transmission signal TX is connected to the attenuator element 160.

As can be further seen from FIG. 1, the attenuator element 160 providing the reception signal RX is connected to an input port of the low noise amplifier 142, an output port of the low noise amplifier 142 is connected to an input port of the third mixer Mx-RI 148, and to an input port of the fourth mixer Mx-RQ 150, an output port of the second phase locked loop PLL 144 is connected to an input port of the second phase-shifter 146, a 0° output port of the phase of the second phase-shifter 146 is connected to another input port of the third mixer 148, a 90° output port of the second phase-shifter 146 is connected to a further input port of the fourth mixer 150, an output port of the third mixer 148 is connected to an input port of the third low pass filter 152, an output port of the fourth mixer 150 is connected to an input port of the fourth low pass filter LP_RQ 154, an output port of the third low pass filter 152 is connected to the first analog-to-digital converter ADC_I 156 and an output port of the fourth low pass filter LP_RQ 154 is connected to an input port of the second analog-to-digital converter ADC_Q 158.

Additionally, in FIG. 1, four exemplary input nodes are shown, see numbers 1 to 4 in dotted circles in FIG. 1, that will also be referred to as first to fourth input nodes or 1" to 4" within the description. The 8 measurement nodes shown in FIG. 1, see numbers 1 to 8 in broken line squares will also be referred to as first to eight measurement node or 1' to 8' in the following description.

The input nodes 1" and 2" are stimulus nodes, wherein the position of the input node 1' corresponds to the position of the output port of the first digital-to-analog converter DAC_I 112, or may correspond more general, to the position of the first digital-to-analog converter DAC_I 112 itself, and the position of the second input node 2" corresponds to the location of the output port of the second digital-to-analog converter DAC_Q 114, or may correspond more general, to the location of the second digital-to-analog converter DAC_Q 114 itself. The input nodes 3" and 4" are condition nodes, wherein the position of the input node 3" corresponds to the position of the first low pass filter 118, and wherein the position of the input node 4" corresponds to the position of the second low pass filter 120.

The position of the measurement node 1' corresponds to the position of the output port of the first mixer 124 or the position of the first mixer 124 itself, the position of the second measurement node 2' corresponds to the position of the output port of the second mixer or the mixer 126 itself, the position of the third measurement node 3' corresponds to the position of the output port of the power amplifier 130 or the position of the power amplifier 130 itself. The position of the fourth measurement node 4' corresponds to the position of the output node of the low noise amplifier 142, or to the position of the low noise amplifier 142 itself, the position of the fifth measurement node 5' corresponds to the position of the output port of the third mixer 148 or the position of the third mixer 148 itself, the position of the sixth measurement node 6' corresponds to the position of the output port of the fourth mixer 150 or the position of the fourth mixer 150 itself, the position of the seventh measurement node 7' corresponds to the position of the input node of the first analog-to-digital converter ADC_I 156 or to the position of the first analog-to-digital converter 156 itself, and the position of the eighth measurement node 8' corresponds to the position of the input port of the second analog-to-digital converter ADC_Q 158 or to the position of the second analog-to-digital converter 158 itself.

In other words, each of the input nodes and measurement nodes is associated to a specific circuit element of the transceiver circuit, for example, the first input node is associated to the first digital-to-analog converter 112. Thus, the localization of a faulty circuit element is facilitated, as will be described later.

In the following, embodiments of the invention will be explained in more detail based on the transceiver circuit as shown in FIG. 1 and further simplifying assumptions, namely: the digital-to-analog converters (DAC) 112, 114 generate a 1 MHz or 10 MHz tone with an amplitude value of "1", the low pass filters (LP) invariably pass a 1 MHz tone and pass a 10 MHz tone only when in a 20 MHz mode, the first mixer Mx-I 124 and the second mixer Mx-TQ 126 sum the passing tones' amplitudes. In other words, at the first and second mixer 124 and 126, the sum of the passing tones' having an amplitude with values 0 or 1 is measured, as can be seen from FIG. 2. At the power amplifier PA 130, the sum of the tones' amplitudes output by the first and second mixer 124, 126 and divided by 2, is measured. At all other measurement nodes for simplicity reasons the same measured values as measured as at the power amplifier 130 are returned.

FIG. 2 shows the table for the signal values measured at the output port of the first mixer Mx-TI 124 according to the aforementioned simplified device functionality in dependence on the test input applied at the first input node 1", being a stimulus node, by which the 1 MHz or 10 MHz tone generated by the first digital-to-analog converter 112 is applied, and for the two nodes of the first low pass filter LP-TI 118, either applying the 2 MHz or the 20 MHz mode. As can be seen from FIG. 2, the 1 MHz tone applied at the first input node 1" from the first digital-to-analog converter 112 is passed without attenuation, whereas the 10 MHz tone passes unattenuated, see value "1" measured at the first mixer Mx-TI 124, when the first low pass filter LP-TI 118 has a 20 MHz tone, and is completely blocked, see value "0" measured at the first mixer Mx-TI 124, when the first low pass filter LP-TI 18 is in the 2 MHz mode.

Figure 3:
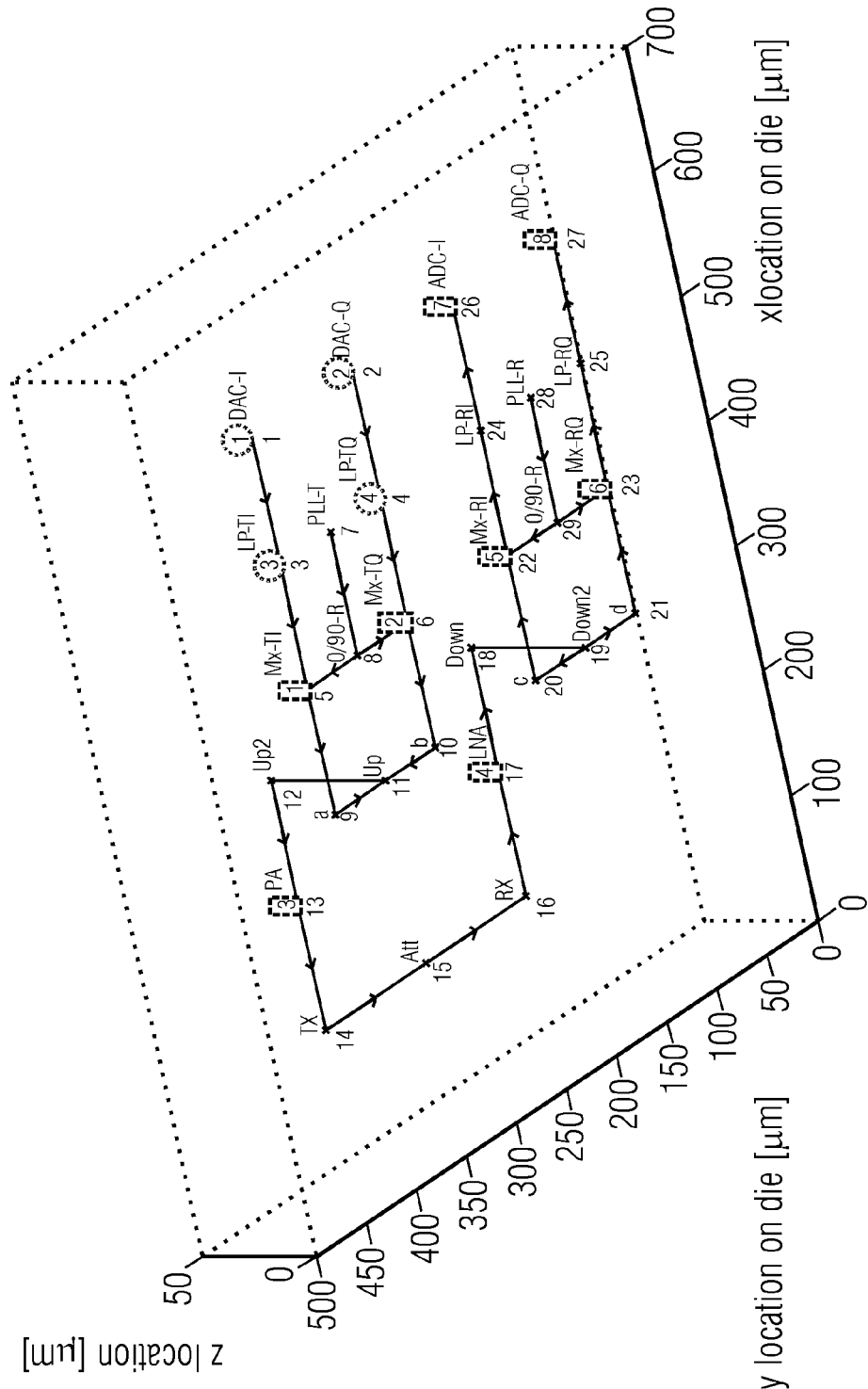
FIG. 3 shows a perspective view of a circuit according to FIG. 1 in a system on package design.

FIG. 3 shows a realization of the transceiver circuit according to FIG. 1 as a "system in package" (SIP) implementation comprising a first or lower chip or die of 50 μm thickness and a second chip or die mounted on top of the first chip respective die. As can be seen from FIG. 3, all circuit elements except the power amplifier 130, the low noise amplifier 142 and the attenuator element 160 are arranged within the first or lower die, whereas the aforementioned elements are arranged within the second or upper chip.

With regard to FIG. 3, 29 nodes n=1 . . . 29 have been defined to describe the location of the circuit elements and the signal paths connecting the circuit elements. Thus, for example, each signal path can be described as one or a plurality of connected straight signal path segments, each defined by two nodes n=1 . . . 29. In other words, the signal path segment 302 can be described by nodes 16 and 17, and signal path segment 304 by nodes 17 and 18. The graph of the circuit, thus, can be described by its signal path segments or node connections, e.g. { . . . , (16,17)(17,18) . . . }.

As can further be seen from FIG. 3, the first input node 1" corresponds to node 1, the second input node 2" corresponds to node 2, the third input node 3" corresponds to node 3, the fourth input node 4" corresponds to node 4, the first measurement node 1' corresponds to node 5, the second measurement node 2' corresponds to node 6, the first phase locked loop PLL corresponds to node 7, the first phase-shifter 122 corresponds to node 8, the third measurement node 3' corresponds to node 13, the fourth measurement node 4' corresponds to node 17, the fifth measurement node 5' corresponds to node 22, the sixth measurement node corresponds to node 23, the seventh measurement node 7' corresponds to node 26, and the eighth measurement node 8' corresponds to node 27. The circuit part of the transceiver circuit 100 implemented on the upper die is connected by an up-link, defined by nodes 11 and 12, and a down-link defined by nodes 18 and 19, to the circuit part of the transceiver circuit implemented on the lower die.

Certain embodiments of the invention comprise providing the following information to perform the diagnosis or diagnosis algorithm:
a) information about the nodes like name and location of the node, for example, for node n=9: Name: DAC-I, Location: (600,400,0);
b) information about inputs (i=1 . . . 4) like node number and stimulus or condition choices, for example, for input i=3: Node: n=3, Choices {2 MHz, 20 MHz};
c) information about the measurements (m=1 . . . 8) like measurement index and node number or node index, for example, for m=8: Node: 27;
d) information about the graph and the node connections, for example, { . . . , (16,17),(17,18), . . . }.

With regard to embodiments of the present invention, two phases, namely "device characterization" and "diagnosis" are distinguished. In the following, the phase of "device characterization" will be described.

During the device characterization, good devices, or in other words, devices with no or negligible faults are evaluated by K tests, each test returning m measurement values Y(k,m), with k=1 . . . K, m=1 . . . M, under known combinations of I input choices U(k,i), with i=1 . . . I.

In the following, various tables in form of matrices will be shown and described, for example, for test input choices, measurement values, measurement deviations, correlation values or relevance values. Within this context, terms like U(k,i) will be used to refer to a single element of the matrix or table, the single element and respectively the position of the single element being defined by its row or line index k and its column index i, and U or UKxI will be used to refer to the table or matrix itself, K specifying the number of rows or lines and I specifying the number of columns of the matrix.

FIG. 4 shows, on the left-hand-side, an exemplary test input matrix U for the transceiver circuit according to FIG. 1 and the further simplifying assumptions described, based on FIGS. 1 and 2. The test input matrix U or UkxI 410 is a KxI-matrix, with K being the number of tests and I being the number of different input nodes. The test input matrix U 410, which can also be referred to as test input scenario or strategy 410, defines for each of the four (I=4) input nodes and for each of the 16 (K=16) tests one choice or selection of the possible choices, as described based on FIG. 2. Each column i of the test input matrix U 410 specifies the input choices applied to a specific input node during the K=16 tests. Each row or line k of the test input matrix U 410 specifies the input choices applied to the I=4 input nodes for each of the respective tests.

On the right-hand side of FIG. 4, the measurement matrix Yd 460 is shown, containing for each of the K=16 tests, the signal values measured at each of the M=8 measurement nodes. Each column m of the measurement matrix Yd 460 contains the signal value measured for each of the K=16 tests at the respective measurement node m. Each row k of the measurement matrix 460 contains the signal values measured at the M=8 different measurement nodes for a specific test k of the K=16 tests.

In other words, a test input scenario or, a short input scenario, UKxI 410 comprises K tests, see the rows of the matrix, wherein each test k of K tests specifies for each input node i of I input nodes, an input choice j of J possible input choices, wherein the input choice j is the content contained in the matrix element specified by the test index and the input index i.

Returning to the right-hand side of FIG. 4, the measurements or measurement values Yd(k,m) can also be represented in the form of a measurement table or matrix YKxM, respectively Yd, 460 that comprises for each test k of the K tests, see rows of the matrix, the signal value measured at each measurement node m of the M measurement nodes, see columns of the matrix. In other words, the measurement matrix Yd contains for each test, represented by the test index k (rows of the matrix), and for each of the measurement nodes, represented by the measurement index m (see columns of the matrix), the respective signal value measured at respective measurement node m during test k.

For an easier understanding, in FIG. 4 the test indices k from 1 to 16 are shown, whereas instead of the input indices i and the measurement indices m, the respective circuit elements according to FIG. 1 are shown.

For example, for test k=1 both digital-to-analog converters DAC-I and DAC-Q apply a 1 MHz tone as input choice, and both low pass filters LP-TI and LP-TQ are in or apply the 2 MHz mode as input choice, so that the 1 MHz signals pass the two low pass filters unattenuated. As the tested device is a "good device" with no faults, at measurement node 1' respectively Mx-TI, and measurement node 2' respectively Mx-TQ, the signal value "1" is measured. The power amplifier PA measures the sum of the values provided by the two mixers Mx-TI and Mx-TQ divided by 2, so that at measurement node 3' also the value "1" is measured. As previously described, for simplicity reasons, all other measurements at the other measurement nodes return the same value as the power amplifier PA, as can be seen for the measured values for test k=1 in the utmost row of the measurement matrix 460.

For test k=2, the first digital-to-analog converter DAC-I applies a 10 MHz tone, the second digital-to-analog converter DAC-Q applies a 1 MHz tone, and as for test k=1, both low pass filters LP-TI and LP-TQ apply the 2 MHz mode as input choice. As described based on FIG. 2, the first mixer Mx-TI filters the 10 MHz signal, and only the second mixer Mx-TQ passes a signal with a signal value of "1" to the summer S 128 and the power amplifier PA 130. The power amplifier PA measures the sum of the filtered signals divided by 2, so that at the third measurement node PA, only a value of 0.5 is measured. The following measurement nodes return the same value, i.e. 0.5 as the power amplifier PA.

For test k=16, both digital-to-analog converters DAC-I and DAC-Q apply a 10 MHz tone as input choice and both low pass filters LP-TI and LP-TQ apply the 20 MHz mode as input choice, so that both 10 MHz signals are passed to the two mixers Mx-TI and Mx-TQ, where at each mixer the signal value "1" is measured, and accordingly, also at the power amplifier PA (see FIG. 4: 20 MHz LP filter passes 10 MHz tone).

The test input choices U(k,i) or input scenario U can be defined by test engineers based on, for example, experience, knowledge about typical critical paths or circuit elements, or can be generated automatically in the sense of an automatic test program generation (ATPG). These automatically generated or selected input choices can be based on random choices, see for example the test input choice U(k,i) on the right-hand side of FIG. 5, or may include all possible combinations of test input choices, see the example of U(k,i) on the left-hand-side of FIG. 5. Within the automatic generation of test input choices, illegal, meaningless, or duplicate combinations can be removed.

In further embodiments, a first set of tests can be generated by test engineers and then enhanced by a second set of automatically generated input choices, to generate in an efficient manner a complete test scenario.

In a next step during characterization, average values μY(k, m) and standard deviations σY(k,m) are collected or determined for all K*M measurements from a statistically sufficient large number of devices D, wherein each individual device for the characterization is indexed by d=1 . . . D.

Figure 6:
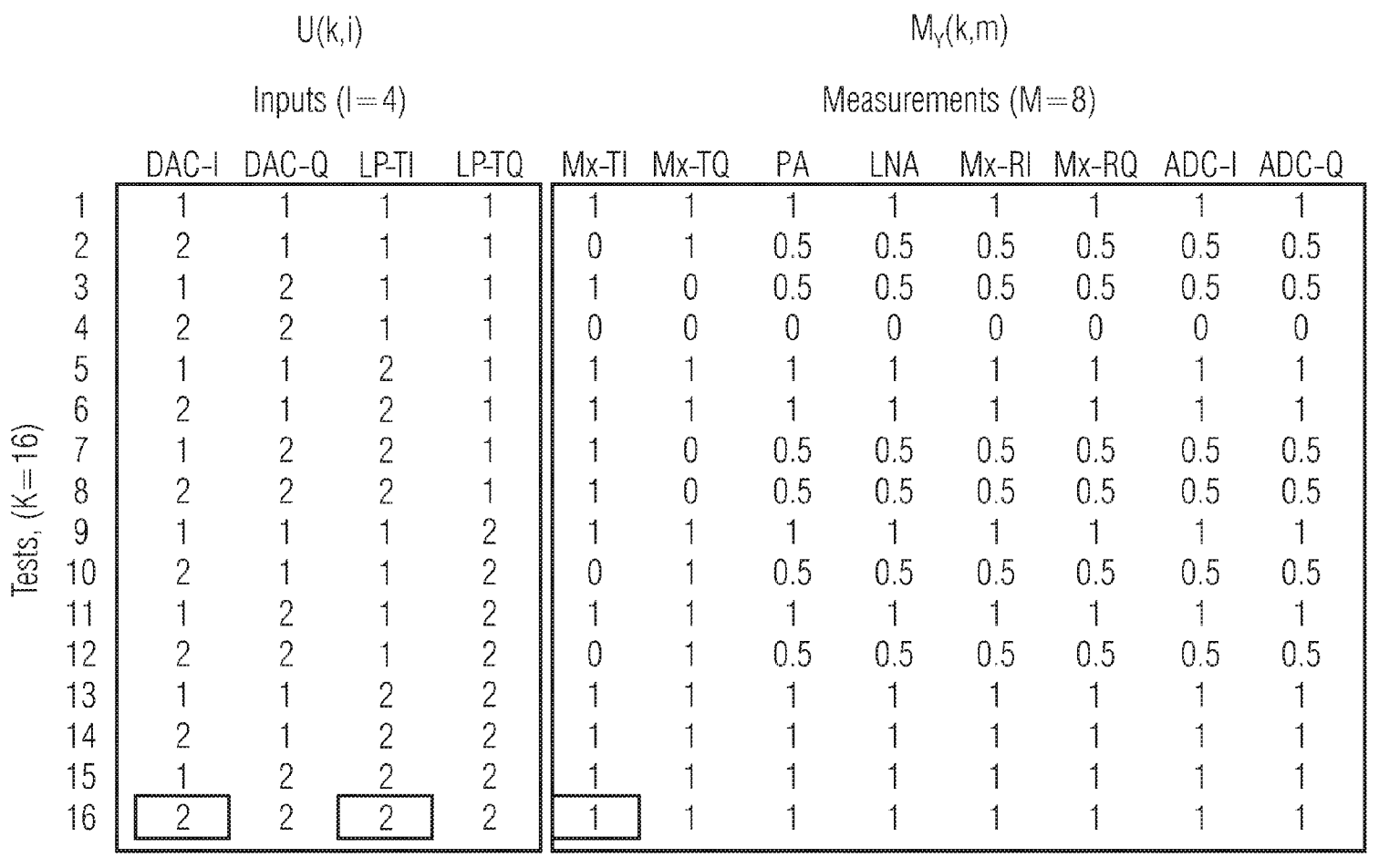

FIG. 6 shows, on the right-hand side, exemplary average measurements μY(k,m), that can be represented in the form of an average measurement matrix μY,KxM like the individual measurement matrices YKxM as described based on FIG. 4. For purposes of statistical evaluation during the characterization, these individual measurement matrices of the devices d will also be referred to as Yd(k,m).

In other words, the average measurement matrix μY comprises for each of the K tests, see rows of the matrix, an average signal value for each measurement node m of the M measurement nodes obtained by applying the same input scenario U(k,i) on the D good devices. For sake of simplicity, all K*M standard deviations are assumed to be σY(k,m)=0.1.

On the left-hand-side of FIG. 6, an alternative representation of the test input scenario U 410 of FIG. 4 is shown, where instead of the text or number representation of the different input choices, an indexed or enumerated type of representation is used. For the two stimulus nodes DAC-I and DAC-Q, index j=1 represents the 1 MHz tone, and index j=2 represents the 10 MHz tone. For the condition nodes LP-TI and LP-TQ, index j=1 represents the 2 MHz mode and index j=2 represents the 20 MHz mode.

The advantage of an enumerated or indexed representation of the input scenario is that not only individual signal values can be used, but also waveforms like fast sine, slow sine, or ramp functions.

In the next phase, the "diagnosis" or testing of potentially faulty devices, also referred to as device under test (DUT), during series or mass production is explained.

In the following, for illustrative purposes, it is assumed that a device under test (DUT) is faulty in that the first low pass filter LP-TI passes only half of the amplitude of the 10 MHz tone in a 20 MHz mode. All other measurements equal the characterized average, or in other words, are equal to the average values obtained during the characterization, and no random deviation is assumed in this example.

In FIG. 7, the measured values at the first measurement node Mx-TI for devices with "no fault" are shown on the left side of the comma, whereas the measured values for the above-mentioned defective device with the abovementioned "fault" are shown on the right side of the comma. The measured values for "no fault" correspond to the values as shown in FIG. 2. As can be seen from FIG. 7, the fault only appears, in case the first stimulus node DAC-I applies the 10 MHz tone and the first condition node LP-TI applies the 20 MHz mode. In other words, the fault is sensitized by the first input node DAC-I applying the second input choice, and is only detectable, in case the first condition node LP-TI applies the second input choice. This fault of −6 dB at 10 MHz is also shown in FIG. 1 (see the star and reference sign 710 in FIG. 1).

For the diagnosis test of the faulty device, the same K*M measurements Y(k,m) are taken from the faulty diagnosed circuit or device under test.

On the left-hand side of FIG. 8, the input scenario U as already used for the characterization is shown. On the right-hand side of FIG. 8, the measurements Y(k,m) of the faulty device are shown. As can be seen from the measurement matrix the fault appears for tests k=6, 8, 14, and 16, For example in test k=16, the first stimulus node DAC-I applies the 10 MHz tone and the first condition node LP-TI applies the 20 MHz mode, where the 10 MHz tone should normally pass without attenuation. However, the faulty 20 MHz LP filter LP-TI passes only half of the MHz tone, as can be seen from the measured value at the first measurement node Mx-TI for the 16th test, i.e. Y(16,1)=0.5. The measurements at the second measurement node Mx-TQ are not influenced by the fault, because up to this measurement node, the signals of the first stimulus node and the second stimulus node are on different and independent signal paths. However, starting from the third measurement node, the power amplifier PA, the modulated I-signal and Q-signal are summed, and thus, the faulty first low pass filter LP_TI causes a deviation of the measured signal value, however, the deviation of the measurement value Y(16,3)=0.75 from the correct value "1" is smaller.

In certain embodiments measurements and inputs are made comparable, before the correlation, by normalizing the deviations from their standard deviations. The inputs U(k,i) of the input scenario are normalized to deviations from their standard deviations across all tests k(1 . . . K). This normalized input scenario VKxI can be pre-computed as part of the characterization. V(k,i) are the normalized input choices.

$$\mu_U(i) = \frac{1}{K} \sum_{k=1}^{K} U(k, i)$$

$$\sigma_u(i) = \frac{1}{K} \sqrt{\sum_{k=1}^{K} (U(k, i) - \mu_U(i))^2}$$

$$V(k, i) = \frac{U(k, i) - \mu_U(i)}{\sigma_U(i)}$$

The measurements Y(k,m) of YKxM of the diagnosed device are normalized to deviations from their standard deviations across all devices, d=1 ... D, used for the characterization. The expected or average measurement value μY(k,m) for each measurement node m under each test k across all D devices and the corresponding standard deviation σY(k,m) can also be pre-computed as part of the characterization, like μU, σu(i) and V(k,i).

$$\mu_Y(k, m) = \frac{1}{D}\sum_{d=1}^{D} Y(k, m)$$

$$\sigma_K(k, m) = \frac{1}{D}\sqrt{\sum_{d=1}^{D}(Y_d(k, m) - \mu_r(k, m))^2}$$

$$Z(k, m) = \frac{Y(k, i) - \mu_r(k, m)}{\sigma_r(k, m)}$$

In other words, the normalized measurement value matrix ZkxI with its normalized measurement values Z(k,i) contains for the diagnosed device deviations of its measurement values from the respective average or expected values obtained during the characterization, wherein the deviation is additionally normalized by the standard deviation obtained during the characterization.

FIG. 9 shows the normalized input scenario V with the normalized input choices V(k,i) on the left-hand side, and on the right-hand side the normalized measurements Z(k,m) according to the aforementioned equations and assumptions. As can be clearly seen from the normalized deviation matrix Z, the matrix Z comprises only for four tests k=6, 8, 13, and 16 deviation values not equal to 0.

According to the invention, an input i is relevant for a fault detection at measurement m when normalized inputs V(k,i) correlate strongly with measurement deviations Z(k,m) and when the measurement deviations Z(k,m) are large.

Figure 10:
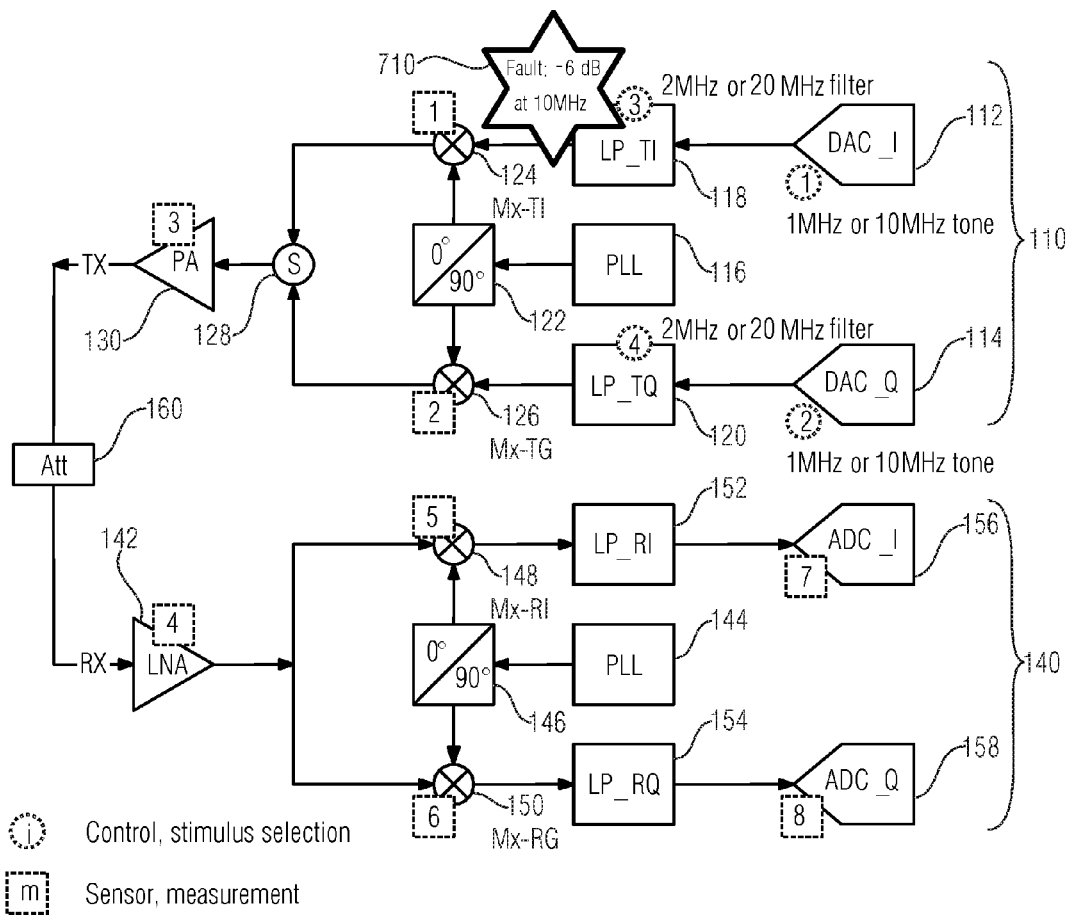
FIG. 10 shows an exemplary relevance matrix R(i,m) generated by an embodiment of the invention.

For determining the relevance measure or relevance value R(i,m) as shown in FIG. 10, certain embodiments of the invention are adapted to compute first the correlation values C(i,m) between inputs i and measurements m, across the diagnosis tests k=1 ... K according to the following equation:

$$C(i, m) = \left|\sum_{k=1}^{K} V(k, i) \cdot Z(k, m)\right|, \quad i = 1 \ldots I, m = 1 \ldots M$$

The fault relevance R(i,m) of input i to measurement m is proportional to the correlation C(i,m) with the column sums of C normalized to the absolute sum of the measurement deviations m. Certain embodiments calculate the respective relevance matrix R(i,m) as follows:

$$R(i, m) = C(i, m), \frac{\sum_{k=1}^{K}|Z(k, m)|}{\sum_{i=1}^{I}|C(k, m)|}, \quad i = 1 \ldots I, m = 1 \ldots M$$

In FIG. 10, the relevance matrix R for the measurement matrix Y respectively the normalized measurement deviation matrix Z of FIG. 9 is shown. The relevance matrix is calculated based on the aforementioned two equations for the calculation of the normalized correlation defining the fault relevance of input i to measurement m. As can be seen from FIG. 10, R(1,1) and R(3,1) are the largest relevance values. Thus, the two pairs (DAC-I, Mx-TI) and (LP-TI, Mx-TI) are most relevant. At the power amplifier PA and the subsequent nodes, the effect is only 50% of the effect for the two aforementioned input and measurement combinations.

A high fault relevance R(i,m) indicates a high likelihood that a fault is close to the signal path from input i to measurement m, or through input i to measurement m.

The diagnosed fault probability F(x,y,z) at die location (x,y,z), also referred to as Fault location probability F(x,y,z), is proportional to the sum of weighted distances L to the signal paths p from inputs i to measurement m, each weighted with relevance R(i,m) and divided by the number of paths P(i,m).

$$F(x, y, z) = \sum_{i=1}^{I}\sum_{m=1}^{M}\sum_{p=1}^{P(i,m)} \frac{R(i, m)/P(i, m)}{1 + L((x, y, z), i, m, p)/L_0}$$

L((x,y,z),i,m,p) is the distance from location (x,y,z) to the p-th path from input i to measurement m. The half-decay length L0 is the desired location resolution.

Figure 11:
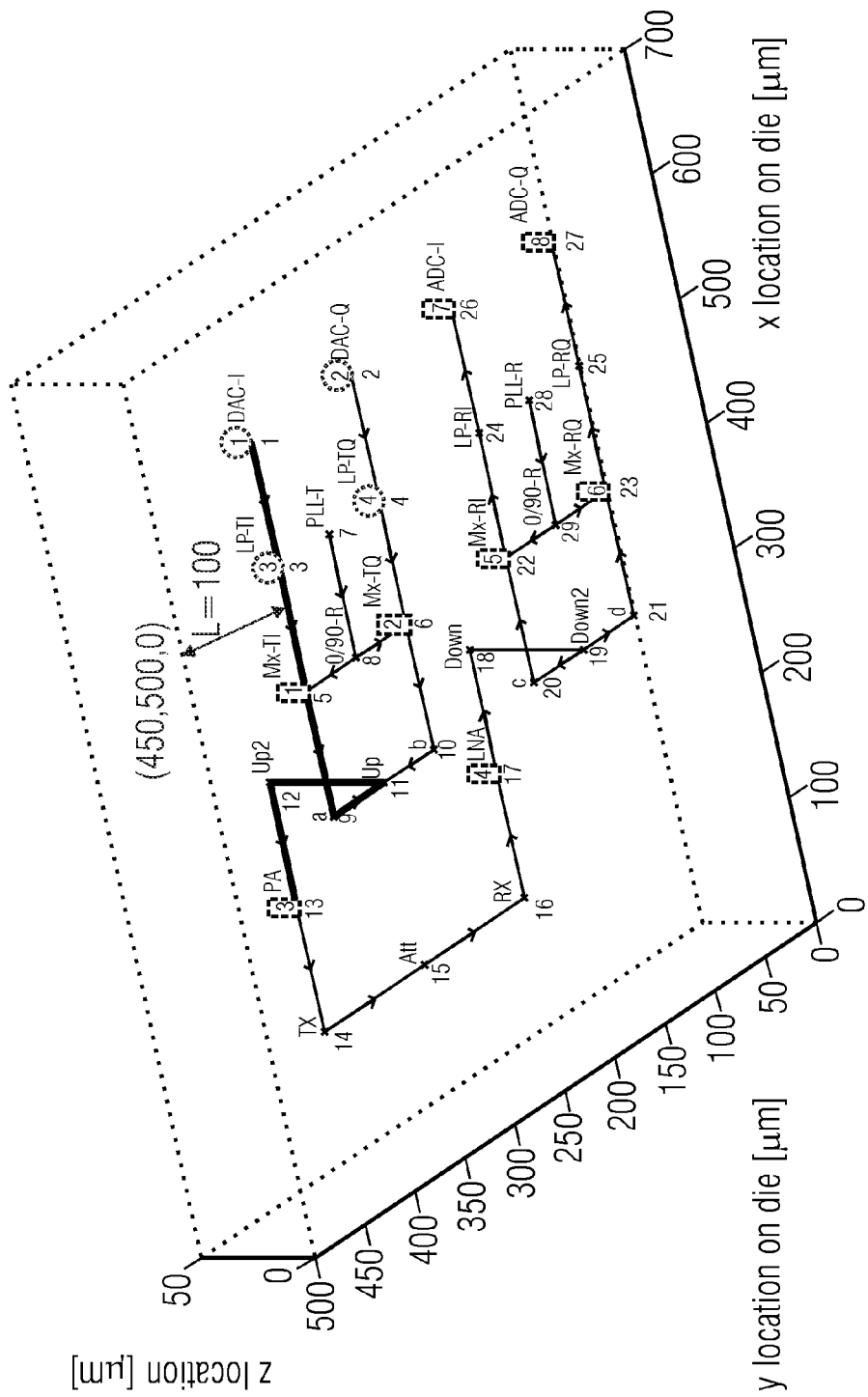
FIG. 11 shows the perspective view of FIG. 3 and the distance L of a location (450,500,0) to the signal path from the first stimulus node DAC-I to the third measurement node PA.

In FIG. 11, an example for a path p and a distance of a point from this path is shown. The signal path starts from input node i=1 to measurement node m=3, and is described by the path index p=1. Path p=1 goes through nodes {1,3,5,9,11,12,13}, the distance L from location (x,y,z)=(450,500,0) is L((x,y,z), i,m,p)=L((450,500,0),1,3,1)=100 as shown in FIG. 11.

The fault probability F(x,y,z) is calculated for all, or at least all relevant locations (x,y,z), and can for example be presented in a color coded fault location probability distribution, where different colors as assigned to different fault location probabilities.

Figure 12:
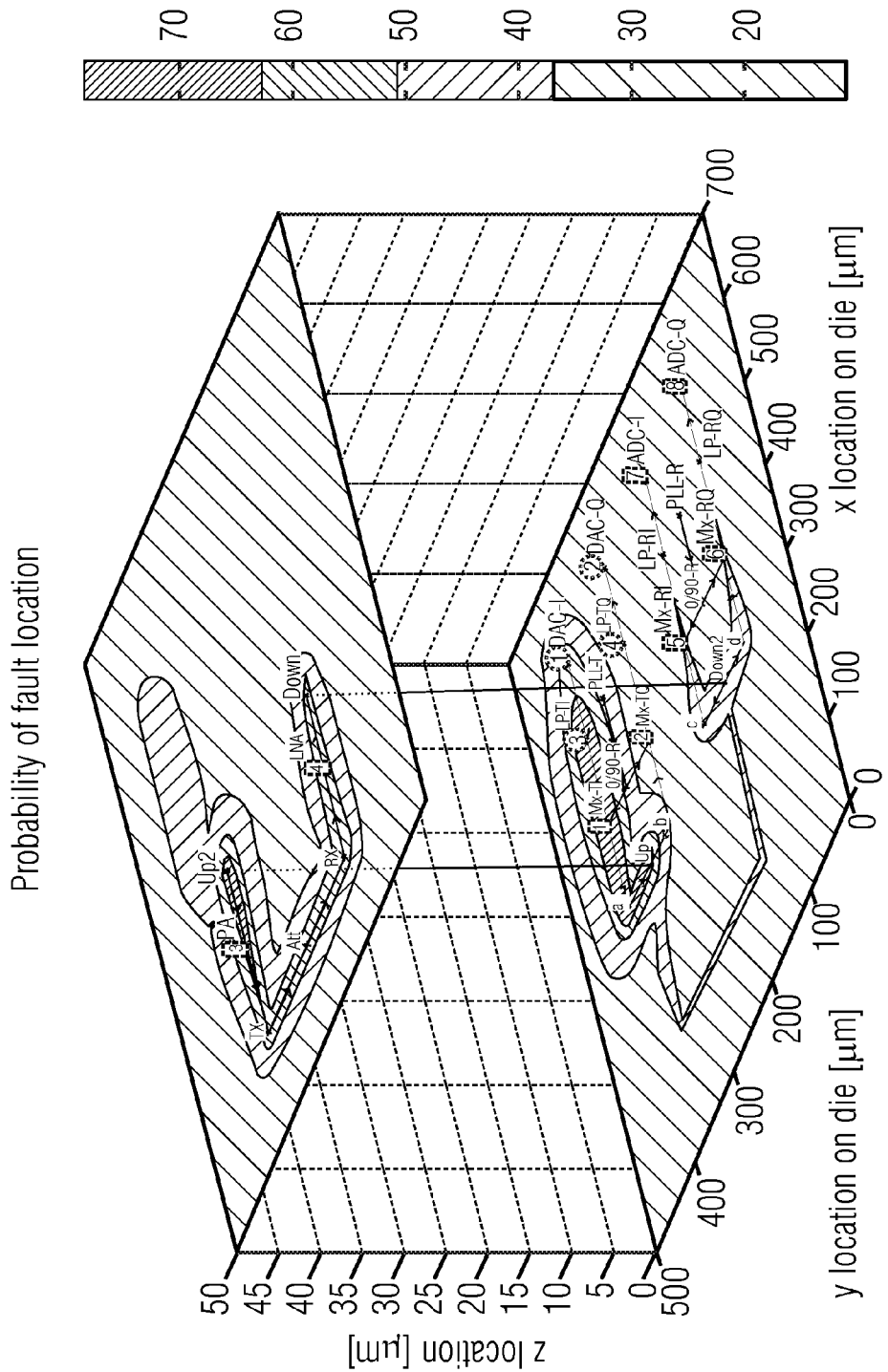
FIG. 12 shows an exemplary fault location probability representation generated by an embodiment of the present invention with knowledge of the signal paths.

In FIG. 12, on the right-hand side, instead of a color coded probability indication, four different fault location probability ranges are depicted by using four different kinds of hashes. As can be seen from FIG. 12, the fault location probability is the largest for areas along the signal path between the faulty third input node LP-TI and the first measurement node Mx-TI, and is still very high up to the third measurement node PA.

Embodiments facilitate the diagnosis of suspicious design structures. Certain embodiments of the present invention allow not only the testing of known design structures but also the test of, for example failure prone, third party design structures, such as intellectual property (IP) blocks, amplifier designs, etc.

Furthermore, a fuse design view based on the layout, in combination with the fault probability view, as shown in FIG. 12, can support human "correlation" to locate faults faster or easier.

Alternatively, the localization of suspicious design structures can be performed algorithmic by correlating (x,y,z) locations of specific design structures, for example, the circuit elements of the transceiver circuit of FIG. 1 with fault location probabilities (x,y,z). Areas with no design structure comprise the value "0" and locations with a design structure are associated with the value "1". Thus, the failure location probability distribution as shown in FIG. 12 is focused on the locations of actual circuit elements and, eventually signal paths. The highest correlation indicates the most suspicious design structure.

Embodiments of the present invention support the diagnosis of non-visible defects and do not need a physical fault analysis.

FIG. 13 shows an embodiment of a recursive search algorithm through a directed graph for all paths from node n1 to n2 to find paths in a graph.

Basically, the recursive search algorithm has the following structure:
1. Start with n=n1.
2. Get all nodes connected to n.
3. Stop when there are no nodes connected to n.
4. When only one node connected, continue at 2. with connected node.
5. When multiple nodes are connected, recursively gather all connected sub-paths.

The distance to a path equals the closest distance d to any of the line segments between subsequence nodes from the path start node to the path end node.

Figure 14:
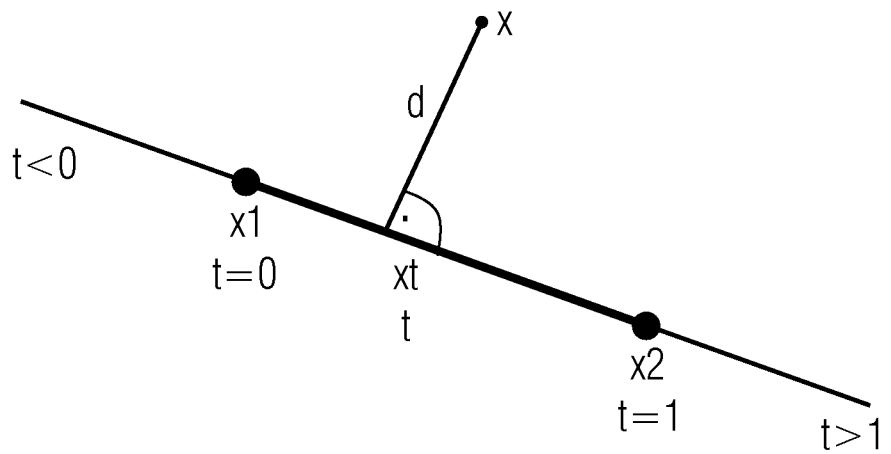
FIG. 14 shows a location x and its distance d to a line segment of a signal path.

FIG. 14 shows the distance d to a line segment point by the nodes x1 and x2.

FIG. 15 shows a search algorithm for determining the closest distance from a point x and an n-dimensional space to a polygon or a line segment of a polygon.

Certain embodiments of the present invention are implemented to use a straight signal path from input i to measurement m, when the signal path is not known. The assumption of a straight signal path from input i to measurement m is reasonable for many radio frequency circuits.

Figure 16:
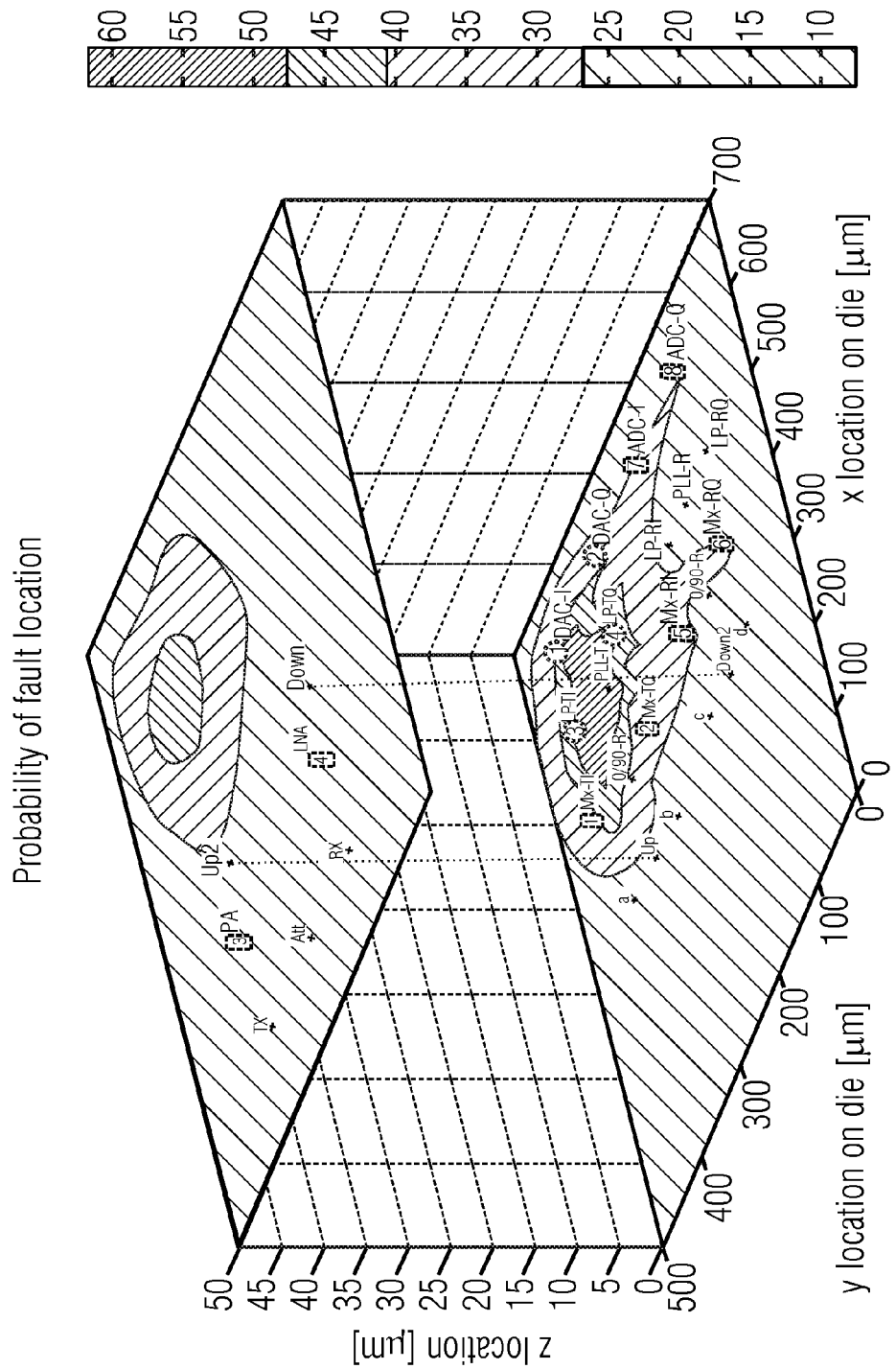
FIG. 16 shows an exemplary fault location probability generated by an embodiment of the present invention without knowledge of the location of the signal paths.

FIG. 16 shows the fault location probability distribution F(x,y,z) for a diagnosis of the faulty radio frequency transceiver according to FIGS. 1 and 3, when the signal path is not known and cannot be used for determining the distance to the signal path. As mentioned before, in this case, straight signal paths can be assumed between inputs i and measurements m. The distance L((x,y,z),i,m,p) and their fault location probability F(x,y,z) are calculated, based on these straight signal paths. As can be seen in FIG. 16, the fault location probability F(x,y,z) is the highest for the faulty third input node LP-TI. This proves that also with no knowledge of the signal graph, helpful indications of the fault location can be obtained by embodiments of the present invention.

Figure 17:
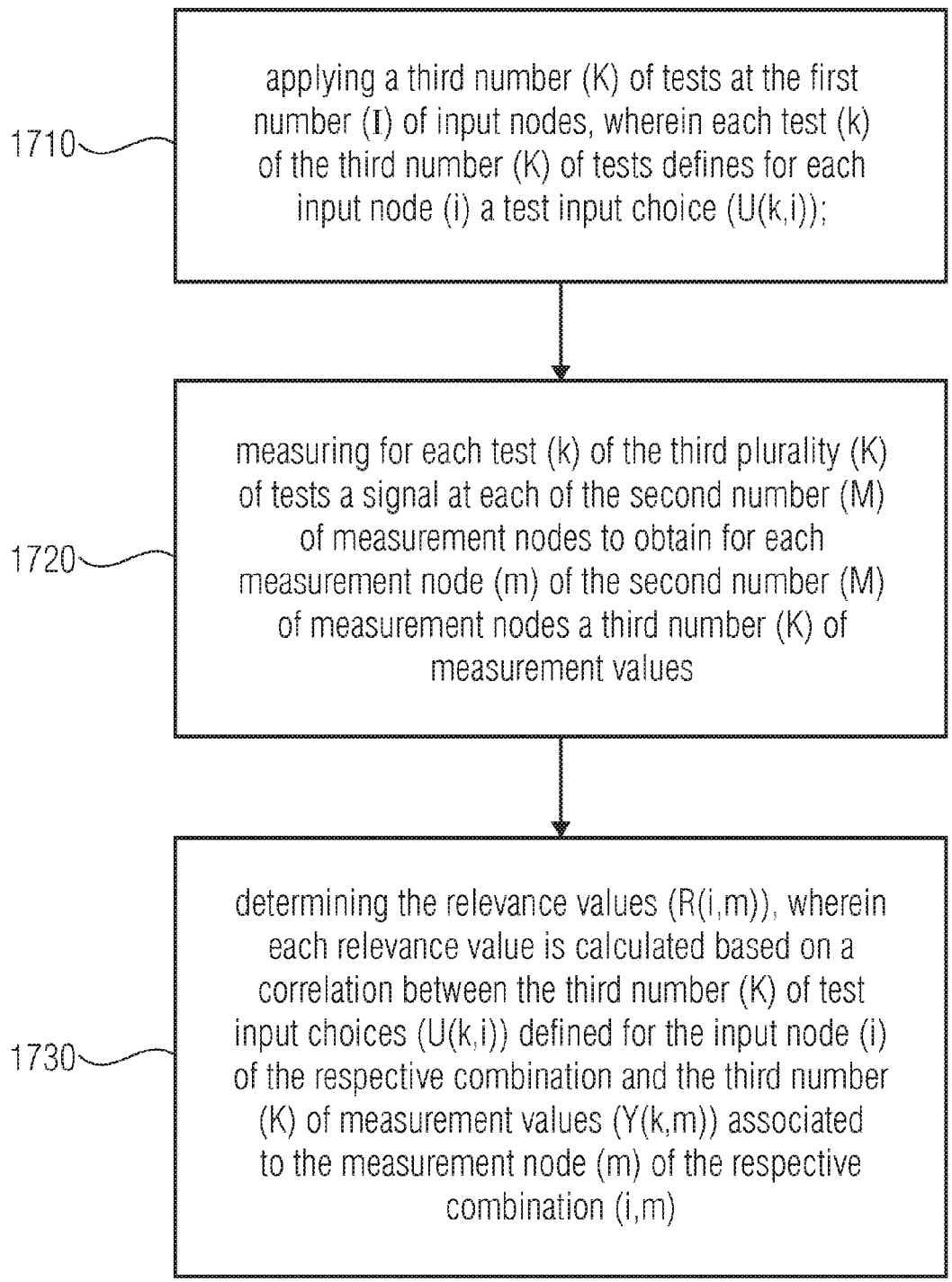
FIG. 17 shows a flowchart of an embodiment of a method for determining relevance values R(i,m) for a detection of a fault on a chip.

FIG. 17 shows a flowchart of an embodiment of a method for determining relevance values R(i,m), each relevance value representing a relevance of a combination (i,m) of an input node i of a first number I of input nodes with a measurement node m of a second number M of measurement nodes for a detection of a fault on a chip. The method comprises the following steps.

Applying 1710 a third number K of tests at the first number I of input nodes, wherein each test k of the third number K of tests defines for each input node i a test input choice U(k,i).

Measuring 1720 for each test k of the third plurality K of tests a signal at each of the second number M of measurement nodes to obtain for each measurement node m of the second number M of measurement nodes a third number K of measurement values, wherein each measurement value Y(k,m) of the K times M measurement values is associated to the test k it was measured for and to the measurement node m it was measured at.

Determining 1730 the relevance values R(i,m), wherein each relevance value is calculated based on a correlation between the third number K of test input choices U(k,i) defined for the input node i of the respective combination and the third number K of measurement values Y(k,m) associated to the measurement node m of the respective combination (i,m).

Embodiments of the method can implement the step 1730 for determining the relevance value such that for the calculation of the correlation each measurement value Y(k,m) is normalized with regard to an average value µY(k,m) associated to the same test k and the same measurement node m as the measurement value Y(k,m).

Embodiments of the method can further implement the step 1730 for determining the relevance value such that for the calculation of the correlation each measurement value Y(k,m) is normalized with regard to a standard deviation σY(k,m) associated to the same test k and the same measurement node m as the measurement value Y(k,m).

Embodiments of the method can implement the step 1730 for determining the relevance value such that the normalized measurement values Z(k,i) are calculated as follows:

$$\mu_Y(k, m) = \frac{1}{D}\sum_{d=1}^{D} Y_d(k, m)$$

$$\sigma_Y(k, m) = \frac{1}{D}\sqrt{\sum_{d=1}^{D} (Y_d(k, m) - \mu_Y(k, m))^2}$$

$$Z(k, m) = \frac{Y(k, i) - \mu_Y(k, m)}{\sigma_Y(k, m)}$$

wherein Y(k,m) is a measurement value associated to a test k and a measurement node m, µY(k,m) is the expected or average measurement value for test k and measurement node m over all D devices obtained during the characterization, wherein σY(k,m) is the standard deviation of the measurement value obtained for test k and measurement node m over all D devices obtained during characterization.

Alternatively to the above example, embodiments can be implemented to perform the normalization Z(k,m) in other ways, for example, the normalization of the measurement values can include the calculation of the difference between the measurement values Y(k,m) and their respective average values µY(k,m) and/or the division of the measurement values or of the aforementioned differences by the respective standard deviations σY(k,m) to improve the correlation result, or can use other algorithms to calculate an average value or equivalents for the standard deviation to obtain similar results.

Embodiments of the method can further implement the step 1730 for determining the relevance value such that for the calculation of the correlation each test input choice U(k,i) is normalized with regard to an average value µU(i) associated to the same input node i as the test input choice U(k,i), wherein the average value µU(i) is an average value of the third plurality K of test input choices associated to the input node i.

Embodiments of the method can further implement the step 1730 for determining the relevance value such that for the calculation of the correlation each test input choice U(k,i) is normalized with regard to a standard deviation σU(i) associated to the same input node i as the test input choice (U(k,i)), wherein the standard deviation (σU(i)) is a standard deviation of the third plurality (K) of test input choices associated to the input node (i).

Embodiments of the method can implement the step 1730 for determining the relevance value such that the normalized test input choices V(k,i) are calculated as follows:

$$\mu_U(i) = \frac{1}{K}\sum_{k=1}^{K} U(k, i)$$

$$\sigma_u(i) = \frac{1}{K}\sqrt{\sum_{k=1}^{K} (U(k, i) - \mu_U(i))^2}$$

$$V(k, i) = \frac{U(k, i) - \mu_U(i)}{\sigma_U(i)}$$

wherein U(k,i) are the test input choices associated to an input node i, μU(i) is the average value over all K test input choices for input node I calculated, and wherein σU(i) is the standard deviation for input node i over all K input choices for input node i.

In alternative embodiments, the normalization V(k,i) of the test input choices can include the calculation of the difference between the individual input choices U(k,i) and the respective average values μU(i) calculated across the respective column i of the test input matrix U and/or the division of the test input choices U(k,i) or of the aforementioned differences by the respective standard deviations σU(i) calculated across the respective column i of the test input matrix U to improve the correlation results, or can use other algorithms to calculate an average value or equivalents for the standard deviation to obtain similar results.

As described before, the average values and the standard deviations can be predetermined or pre-computed during the characterization phase, so that for the later diagnosis these pre-computed values can be provided to reduce the processing power requirements for the diagnosis.

Embodiments of the method can implement the step 1730 for determining the relevance value such that the correlation value C(i,m) obtained by the correlation is already the relevance value R(i,m) used for a further diagnosis without the need for further calculations.

Embodiments of the method can implement the step 1730 for determining the relevance value such that the correlation values C(i,m) are calculated as follows:

$$C(i, m) = \left| \sum_{k=1}^{K} V(k, i) \cdot Z(k, m) \right|, \quad i = 1 \ldots I, m = 1 \ldots M,$$

wherein i is the index of the input nodes with i=1 ... I, m is the index for the measurement nodes with m=1 ... M, k is the index for the tests with k=1 ... K, wherein V(k,i) are the test input choices U(k,i) normalized to average values μU(i) and standard deviations σU(i) associated to the same input node i calculated across all K input choices for the respective input node i, and Z(k,m) are the measurement values Y(k,m) normalized to average values μY(k,m) and standard deviations σY(k,m) associated to the same test k and the same measurement node m obtained across the D tests during characterization.

Embodiments of the method can implement the step 1730 for determining the relevance value such that the fault relevance values R(i,m) are determined at follows:

$$R(i, m) = C(i, m) \cdot \frac{\sum_{k=1}^{K} |Z(k, m)|}{\sum_{i=1}^{I} |C(k, m)|}, \quad i = 1 \ldots I, m = 1 \ldots M$$

wherein i is the index of the input nodes with i=1 ... I, m is the index for the measurement nodes with m=1 ... M, k is the index for the tests with k=1 ... K, wherein Z(k,m) is a measurement value Y(k,m) normalized to deviations from its standard deviation across all K test input choices, and wherein C(i,m) is the correlation value between input node i and measurement node m of the device under test.

In other words, embodiments can be adapted to calculate a fault relevance R(i,m) of each input node i to each measurement m that is proportional to the correlation value C(i,m), with the column sums of the correlation matrix C normalized to the absolute sum of measurement deviations m.

Alternative embodiments can be adapted to calculate the relevance values, generally speaking, based on the correlation values C(i,m) and a weighting factor, wherein the weighting factor is calculated such that it depends on a sum of the K measurement deviations Z(k,m) associated to the same measurement node m and/or is the higher the measurement deviations Z(k,m) associated to the same measurement node m are, and/or wherein the weighting factor depends on a sum of correlation values C(i,m) associated to the same measurement node m and/or is the lower the higher the correlation values C(i,m) associated to the same measurement node m are.

As can been seen from FIG. 10, the relevance matrix R or even individual relevance values R(i,m) can already provide sufficient information for at least narrowing down the localization of the fault.

Figure 18:
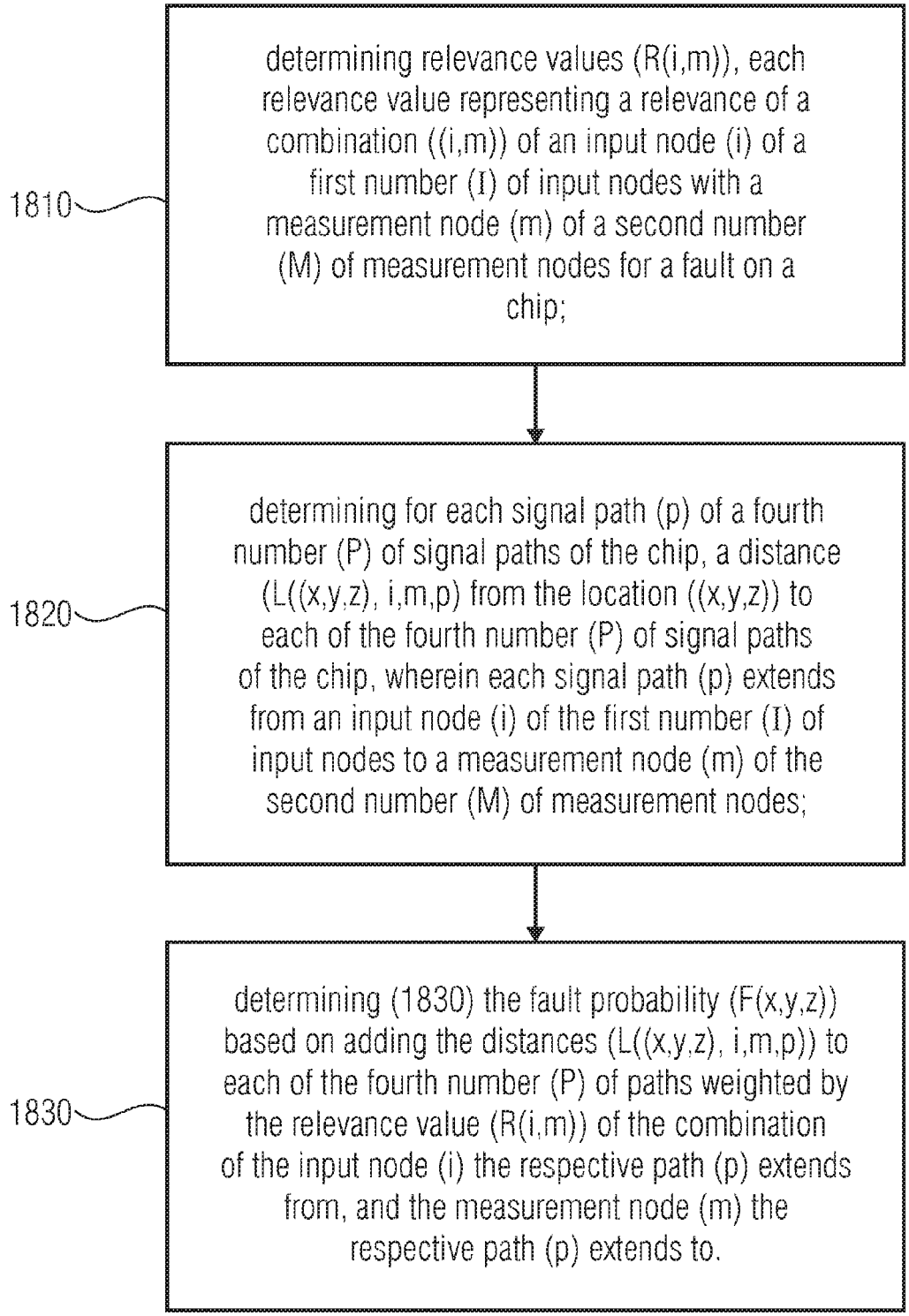
FIG. 18 shows a flowchart of an embodiment of a method for determining a fault probability of a location on a chip.

FIG. 18 shows a flowchart of an embodiment of a method for determining a fault probability for a location on a chip. The method comprising the following steps.

Determining 1810 relevance values R(i,m) according to one of the claims 1 to 11, each relevance value representing a relevance of a combination (i,m) of an input node i of a first number I of input nodes with a measurement node (m) of a second number M of measurement nodes for a detection of a fault on a chip.

Determining 1820 for each signal path p of a fourth number P of signal paths of the chip, a distance L((x,y,z), i,m,p) from the location (x,y,z) to each of the fourth number P of signal paths of the chip, wherein each signal path (p) extends from an input node i of the first number I of input nodes to a measurement node m of the second number M of measurement nodes.

Determining 1830 the fault probability F(x,y,z) based on adding the distances L((x,y,z), i,m,p) to each of the fourth number P of paths weighted by the relevance value R(i,m) of the combination of the input node i, the respective path p extends from, and the measurement node m the respective path p extends to.

Embodiments of the method can implement the step 1830 for determining the fault probability F(x,y,z) based on the following algorithm:

$$F(x, y, z) = \sum_{i=1}^{I} \sum_{m=1}^{M} \sum_{p=1}^{P(i,m)} \frac{R(i, m)/P(i, m)}{1 + L((x, y, z), i, m, p)/L_0},$$

wherein (x,y,z) is the location, wherein i is the index of the input nodes with i=1 ... I, m is the index for the measurement nodes with m=1 ... M, wherein P(i,m) is the number of paths from input node i to measurement node m, wherein R(i,m,) is the relevance value of the combination (i,m) of an input node i with a measurement node m, wherein L((x,y,z),i,m,p) is the distance from location (x,y,z) to the p-th path from input node i to measurement m, and wherein L0 is the half-decay length defining the location resolution.

Alternative embodiments of the invention can be implemented to use different algorithms than the one described above or amended algorithms, for example the algorithm a described above without the half-decay length L0 and/or without the number paths P(i,m) between the same combination of inputs node and measurement node.

In case the position of the signal paths are known, embodiments of the inventions can be adapted to use this information for the calculation of the distance L providing a position information for each input node i. The position of the signal paths can, for example, be defined by providing for each path p of the fourth number of paths a plurality of further nodes to define the position of the path p or segment of the path between the position of the input node i and the position of the measurement node m (see FIGS. 3 and 11).

In case the position of all or some signal paths between the circuit elements are not known, these paths p can be assumed to be straight lines between the position of the input node i and the position of the measurement node m defining the signal path.

Embodiments of the invention can be implemented to calculate the fault location probabilities for all or at least all relevant locations on the chip to obtain a fault location distribution of as shown in FIGS. 12 and 16. Such a color coded presentation, for example, together with a presentation of the positions of the circuit elements provides a useful means for localizing faults or at least error prone regions of a chip design.

Embodiments of the invention can be further implemented to additionally correlate the fault probability $F(x,y,z)$ of each location $(x,y,z)$ with an position indicator, the position indicator having different values for locations $(x,y,z)$ of the chip, for example "0" for positions with no circuit element and "1" for positions with a circuit element, to, thus, focus the fault localization to locations where input nodes, measurement nodes or signal paths are positioned.

Embodiments of an apparatus for determining the relevance values describing a relevance of I input nodes for a fault detection at M measurement nodes of a chip comprise at least one input port for receiving the measurement values $Y(k,m)$, for receiving the expected or average values $\mu Y(k,m)$, the standard deviations $\sigma Y(k,m)$ and the corresponding input choices $U(k,i)$ or normalized input choices $V(k,i)$, and an output port for providing at least the correlation $C(i,m)$ or relevance values $R(i,m)$. Further embodiments can comprise at least one additional input port for applying the test choices $U(k,i)$ to the device under test, or in other words, to connect the apparatus with the device under test for the characterization and/or the diagnosis. Further embodiments of the apparatus are additionally implemented to determine the fault probability of a location based on known locations of the input nodes and measurement nodes. Even further embodiments of the present application are implemented to determine the fault probability of a location on the chip based on the additional knowledge about the location of the signal graphs connecting the input nodes with the measurement nodes.

Embodiments of the apparatus adapted to determine the fault probability can also comprise an output port for providing the fault probability for some or all of the 2-dimensional locations $(x,y)$ or 3-dimensional locations $(x,y,z)$, for example as shown in FIG. 12 or 16.

Further embodiments of the apparatus may also be implemented to perform the characterization by performing the tests for D good, or essentially good devices to calculate the expected values $\mu Y(k,m)$ and the standard deviations $\sigma Y(k,m)$ and to output the input choices $U(k,i)$ for normalized input choices $V(k,i)$.

Embodiments of the apparatus adapted to perform the characterization can comprise user interfaces for defining the input nodes, measurement nodes and/or input choices, or to select certain input nodes, measurement nodes and/or input choices from an available set of input nodes, measurement nodes and/or input choices. Further embodiments of the invention can be adapted to select or choose input nodes, measurement nodes and/or input choices from a given set of nodes or ranges, or sets of input choices automatically.

The "Characterization" can be performed, for example, by development or test engineers once, when the product is designed, for example, in a pre-series production, based on testing true devices (no simulation). The "Diagnosis" of the devices can be performed at the mass production sites to control the quality and gain of the mass production, respectively to control a deviation or un-usuality within the mass production or to detect a design weakness by testing a plurality of faulty devices.

Embodiments of the invention can be adapted to add, for example, the fault probabilities $F(x,y,z)$ for each location of a plurality of faulty devices to facilitate the detection of design weaknesses of the chip or its circuit elements. Furthermore, error prone library elements can thus be detected. If for example, the fault location probability is not only high for a specific low pass filter LP_TI but also for the other low pass filters LP_TQ, LP_RI and LP-RQ, all defined by the same library element, a test engineer can derive that this element or module in general is error prone.

Advantages of embodiments of the present invention are its simplicity, as no simulation is needed, as no access to a chip simulation model is needed, as no modeling of the test interaction is needed and as no lengthy (fault) simulations are needed.

Furthermore, there is no need to assume fault models, no need to know details about the device-under-test (DUT) and about the test. Additionally test combinations can be automatically generated.

The approach of the invention is generic in that the device under test is modeled as a black box with a set of input choices $U(k,i)$ and a set of output measurements $Y(k,i)$.

Embodiments of the invention provide a means for increasing the radio frequency coverage at wafer tests for PGD flows by enabling massive multi-site wafer tests on non-radio frequency equipment and/or by allowing to postpone performance tests of radio frequency tests to final tests.

Furthermore, embodiments enable to diagnose design weaknesses in radio frequency circuits during high-volume manufacturing and/or to diagnose non-visible defects or weaknesses.

Although, embodiments of the invention have been described, where the relevance of I inputs, respectively input nodes, to M measurements, respectively measurement nodes, have been determined, alternative embodiments can be implemented to determine a relevance for a single input to a single measurement, the relevance of I inputs to a single measurement or the relevance of a single input to M measurements.

Depending on implementation requirements of the inventive methods, the inventive methods can be implemented in hardware or in software. The implementation can be performed using a digital storage medium, in particular, a disc, CD or a DVD having an electronically readable control signal stored thereon, which cooperates with a programmable computer system, such that an embodiment of the inventive methods is performed. Generally, an embodiment of the present invention is, therefore, a computer program product with a program code stored on a machine-readable carrier, the program code being operative for performing the inventive methods when the computer program product runs on a computer. In other words, embodiments of the inventive methods are, therefore, a computer program having a program code for performing at least one of the inventive methods when the computer program runs of a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method comprising:
applying, using a computer, a number of tests at a number of input nodes of a circuit chip, wherein each test defines for each input node a test input choice;
measuring for each test a signal at each of a number of measurement nodes to acquire for each measurement node a number of measurement values, wherein each measurement value is associated to the test it was measured for and to the measurement node it was measured at;
determining relevance values for detection of a fault on the circuit chip, wherein each relevance value is calculated based on a correlation between normalized test input choices and normalized measurement values associated to the test it was measured for and to the measurement node it was measure at.

2. The method according to claim 1, wherein for the calculation of the correlation, each measurement value is normalized with regard to an average value associated to the same test and the same measurement node as the measurement value.

3. The method according to claim 1, wherein for the calculation of the correlation, each measurement value is normalized with regard to a standard deviation associated to the same test and the same measurement node as the measurement value.

4. The method according to claim 1, wherein for the calculation of the correlation, each test input choice is normalized with regard to an average value associated to the same input node as the test input choice, wherein the average value is an average value of the plurality of test input choices associated to the input node.

5. The method according to claim 1, wherein for the calculation of the correlation, each test input choice is normalized with regard to a standard deviation associated to the same input node as the test input choice, wherein the standard deviation is a standard deviation of the plurality of test input choices associated to the input node.

6. The method according to claim 1, wherein the relevance value is the correlation value.

7. The method according to claim 1, wherein the correlation is calculated as follows:

$$C(i, m) = \left| \sum_{k=1}^{K} V(k, i) \cdot Z(k, m) \right|, \quad i = 1 \ldots I, m = 1 \ldots M$$

wherein i is the index of the input nodes with i=1 . . . I, m is the index for the measurement nodes with m=1 . . . M, k is the index for the tests with k=1 . . . K, wherein V(k,i) are the test input choices normalized to average values and/or standard deviations associated to the same input node i, and Z(k,m) are the measurement values normalized to the average values and/or standard deviations associated to the same test k and the same measurement node m.

8. The method according to claim 7, wherein the normalized test input choices V(k,i) are calculated as follows:

$$\mu_U(i) = \frac{1}{K} \sum_{k=1}^{K} U(k, i)$$

$$\sigma_u(i) = \frac{1}{K} \sqrt{\sum_{k=1}^{K} (U(k, i) - \mu_U(i))^2}$$

$$V(k, i) = \frac{U(k, i) - \mu_U(i)}{\sigma_U(i)}$$

wherein U(k,i) are the test input choices associated to an input node i, μU(i) is the average value over all K test input choices for input node i, and wherein σU(i) is the standard deviation for input node i (input choices) over all K input choices for input node I.

9. The method according to claim 7, wherein the normalized measurement values Z(k,i) are calculated as follows:

$$\mu_Y(k, m) = \frac{1}{D} \sum_{d=1}^{D} Y(k, m)$$

$$\sigma_Y(k, m) = \frac{1}{D} \sqrt{\sum_{d=1}^{D} (Y_d(k, m) - \mu_r(k, m))^2}$$

$$Z(k, m) = \frac{Y(k, i) - \mu_Y(k, m)}{\sigma_Y(k, m)}$$

wherein Y(k,m) is a measurement value associated to a test k and a measurement node m, μY(k,m) is the average measurement value for test k and measurement node m, wherein σY(k,m) is the standard deviation of the measurement value acquired for test k and measurement node m.

10. The method according to claim 1, wherein the relevance values are calculated based on the correlation values and a weighting factor,
wherein the weighting factor is calculated such that it is the higher the higher measurement deviations for all measurements associated to the same measurement node are, wherein a measurement deviation is a deviation of a measurement value associated to a test and a measurement node from an average value associated to the same test and the same measurement node as the measurement value, and/or
wherein the weighting factor is the lower the higher the correlation values for all measurements associated to the same measurement node are.

11. The method according to claim 10, wherein the fault relevance is determined as follows:

$$R(i, m) = C(i, m), \frac{\sum_{k=1}^{K} |Z(k, m)|}{\sum_{i=1}^{I} |C(k, m)|}, \quad i = 1 \ldots I, m = 1 \ldots M$$

wherein i is the index of the input nodes with i=1 . . . I, m is the index for the measurement nodes with m=1 . . . M, k is the index for the tests with k=1 . . . K, wherein K(k,m) is a measurement value normalized to deviations from its standard deviation across all K test input choices, and wherein C(i,m) is the correlation value between input node i and measurement node m.

12. A method for determining a fault probability of a location on a chip, comprising:
    determining relevance values according to claim 1, each relevance value representing a relevance of a combination of an input node of a first number of input nodes with a measurement node of a second number of measurement nodes for a detection of a fault on a chip,
    determining for each signal path of a fourth number of signal paths of the chip, a distance from the location to each of the fourth number of signal paths of the chip, wherein each signal path extends from an input node of the first number of input nodes to a measurement node of the second number of measurement nodes; and
    determining the fault probability based on adding the distances to each of the fourth number of paths weighted by the relevance value of the combination of the input node the respective path extends from, and the measurement node the respective path extends to.

13. The method according to claim 12, wherein the fault probability F(x,y,z) is determined as follows:

$$F(x, y, z) = \sum_{i=1}^{I} \sum_{m=1}^{M} \sum_{p=1}^{P(i,m)} \frac{R(i,m)/P(i,m)}{1 + L((x,y,z),i,m,p)/L_0}$$

wherein (x,y,x) is the location, wherein i is the index of the input nodes with i=1 ... I, m is the index for the measurement nodes with m=1 ... M, wherein P(i,m) is the number of paths from input node i to measurement node m, wherein R(i,m,) is the relevance value of the combination (i,m) of an input node i with a measurement node m, wherein L((x,y,z),i,m,p) is the distance from location (x,y,z) to the p-th path from input node i to measurement m, and wherein L0 is the half-decay length defining the location resolution.

14. The method according to claim 12, further comprising:
    providing a position information for each input node and each measurement node and defining a path of the fourth number of paths as a straight line between the position of the input node and the position of the measurement node.

15. The method according to claim 12, further comprising:
    providing a position information for each input node and each measurement node, and providing for a path of the fourth number of paths a plurality of further nodes to define the position of the path between the position of the input node and the position of the measurement node.

16. The method according to claim 12, further comprising:
    correlating the fault probability with a position indicator, the position indicator comprising different values for locations of the chip, where input nodes, measurement nodes or signal paths are positioned compared to locations, where none of these are positioned.

17. The method according to claim 12, further comprising:
    determining the fault probability of a plurality of locations on a chip to acquire a fault probability distribution with regard to the plurality of fault probabilities.

18. The method according to one of the claim 1, further comprising:
    applying to each chip of a fifth number of chips the third number of tests at the first number of input nodes, wherein each test of the third number of tests defines for each input node a test input choice;
    measuring for each test of the third plurality of tests a signal at each of the second number of measurement nodes to acquire for each measurement node of the second number of measurement nodes a third number of measurement values, wherein each measurement value of the third number of measurement values is associated to the test it was measured for and to each measurement node it was measured at; and
    determining average values and standard deviations associated to each test and test input choice across the fifth number of measurement values.

19. An apparatus for performing a method of claim 1.

20. A computer program for performing, when running on a computer, the method comprising:
    applying, using the a computer, a number of tests at a number of input nodes of a circuit chip, wherein each test defines for each input node a test input choice;
    measuring for each test a signal at each of a number of measurement nodes to acquire for each measurement node a number of measurement values, wherein each measurement value is associated to the test it was measured for and to the measurement node it was measured at;
    determining relevance values for detection of a fault on the circuit chip, wherein each relevance value is calculated based on a correlation between normalized test input choices and normalized measurement values associated to test it was measured for and to the measurement node it was measure at.

21. Computer program for performing, when running on a computer, the method for determining a fault probability of a location on a chip, comprising:
    determining relevance values according to claim 20, each relevance value representing a relevance of a combination of an input node of a first number of input nodes with a measurement node of a second number of measurement nodes for a detection of a fault on a chip,
    determining for each signal path of a fourth number of signal paths of the chip, a distance from the location to each of the fourth number of signal paths of the chip, wherein each signal path extends from an input node of the first number of input nodes to a measurement node of the second number of measurement nodes; and
    determining the fault probability based on adding the distances to each of the fourth number of paths weighted by the relevance value of the combination of the input node the respective path extends from, and the measurement node the respective path extends to.

* * * * *